(12) United States Patent
Kim et al.

(10) Patent No.: US 12,004,371 B2
(45) Date of Patent: Jun. 4, 2024

(54) DISPLAY APPARATUS

(71) Applicant: Samsung Display Co., Ltd., Yongin-si (KR)

(72) Inventors: Hyoeng-Ki Kim, Suwon-si (KR); Junhyuk Woo, Yongin-si (KR); Eonjoo Lee, Hwaseong-si (KR); Hyeonbum Lee, Hwaseong-si (KR); Jin-Whan Jung, Yongin-si (KR); Dongki Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 539 days.

(21) Appl. No.: 17/286,416

(22) PCT Filed: Oct. 17, 2019

(86) PCT No.: PCT/KR2019/013694
§ 371 (c)(1),
(2) Date: Apr. 16, 2021

(87) PCT Pub. No.: WO2020/080864
PCT Pub. Date: Apr. 23, 2020

(65) Prior Publication Data
US 2021/0391558 A1 Dec. 16, 2021

(30) Foreign Application Priority Data
Oct. 18, 2018 (KR) .................. 10-2018-0124229

(51) Int. Cl.
*H10K 50/858* (2023.01)
*G06F 3/041* (2006.01)
(Continued)

(52) U.S. Cl.
CPC ......... *H10K 50/858* (2023.02); *H10K 50/865* (2023.02); *H10K 59/40* (2023.02); *G06F 3/0412* (2013.01); *H10K 59/122* (2023.02)

(58) Field of Classification Search
CPC ......... G06F 3/0412; G06F 2203/04111; G06F 2203/04112; G06F 3/0445; G06F 3/0443;
(Continued)

(56) References Cited

U.S. PATENT DOCUMENTS 9,484,557 B2    11/2016   Choi et al.
10,068,957 B2   9/2018    Kim et al.
(Continued)

FOREIGN PATENT DOCUMENTS

CN    102713802 A    10/2012
CN    106293197 A    1/2017
(Continued)

*Primary Examiner* — Muhammad N Edun
(74) *Attorney, Agent, or Firm* — Lewis Roca Rothgerber Christie LLP

(57) ABSTRACT

A display apparatus includes: a display layer including a plurality of organic light emitting elements, and defining a plurality of light emitting areas and a non-light emitting area surrounding the light emitting areas; and an input sensing layer on the display layer. The input sensing layer includes: a first conductive pattern on the display layer; an insulating layer on the first conductive pattern to cover the first conductive pattern, and defining a plurality of light collecting patterns overlapping with the light emitting areas in a plan view; a second conductive pattern on a top surface of the insulating layer; and an overcoat layer on the second conductive pattern to cover the insulating layer and the second conductive pattern. Each of the light collecting patterns is recessed downward from the top surface of the insulating layer.

20 Claims, 20 Drawing Sheets

(51) Int. Cl.
   *H10K 50/86* (2023.01)
   *H10K 59/122* (2023.01)
   *H10K 59/40* (2023.01)

(58) Field of Classification Search
   CPC .... H10K 59/12; H10K 50/865; H10K 50/856; H10K 50/858; H10K 59/40; H10K 59/122; H10K 59/351
   See application file for complete search history.

(56) References Cited

U.S. PATENT DOCUMENTS

| | | | |
|---|---|---|---|
| 10,168,844 B2 | 1/2019 | Kwon et al. | |
| 10,319,792 B2 | 6/2019 | Jo et al. | |
| 10,490,610 B2 | 11/2019 | Kim | |
| 10,514,809 B2 | 12/2019 | Jeong et al. | |
| 2009/0114917 A1* | 5/2009 | Yamazaki | H01L 29/66765 257/E29.004 |
| 2012/0139848 A1 | 6/2012 | Lee et al. | |
| 2012/0200928 A1 | 8/2012 | Kim et al. | |
| 2015/0048316 A1* | 2/2015 | Choi | H10K 50/865 257/40 |
| 2015/0049030 A1 | 2/2015 | Her | |
| 2016/0164049 A1* | 6/2016 | Choi | H10K 50/84 438/27 |
| 2016/0378224 A1 | 12/2016 | Kwon et al. | |
| 2017/0177128 A1 | 6/2017 | Son | |
| 2017/0212625 A1 | 7/2017 | Lee et al. | |
| 2018/0095566 A1 | 4/2018 | Lee et al. | |
| 2018/0357460 A1* | 12/2018 | Smith | H10K 59/40 |
| 2019/0129541 A1 | 5/2019 | Kwon et al. | |

FOREIGN PATENT DOCUMENTS

| | | |
|---|---|---|
| KR | 10-2015-0004974 A | 1/2015 |
| KR | 10-2017-0001935 A | 1/2017 |
| KR | 10-2017-0073774 A | 6/2017 |
| KR | 10-2017-0089448 A | 8/2017 |
| KR | 10-2017-0109184 A | 9/2017 |
| KR | 10-2017-0121674 A | 11/2017 |
| KR | 10-1793073 B1 | 11/2017 |
| KR | 10-2018-0036325 A | 4/2018 |
| KR | 10-2018-0076688 A | 7/2018 |
| KR | 10-2018-0076689 A | 7/2018 |
| WO | WO 2011/043611 A2 | 4/2011 |

\* cited by examiner

FIG. 5
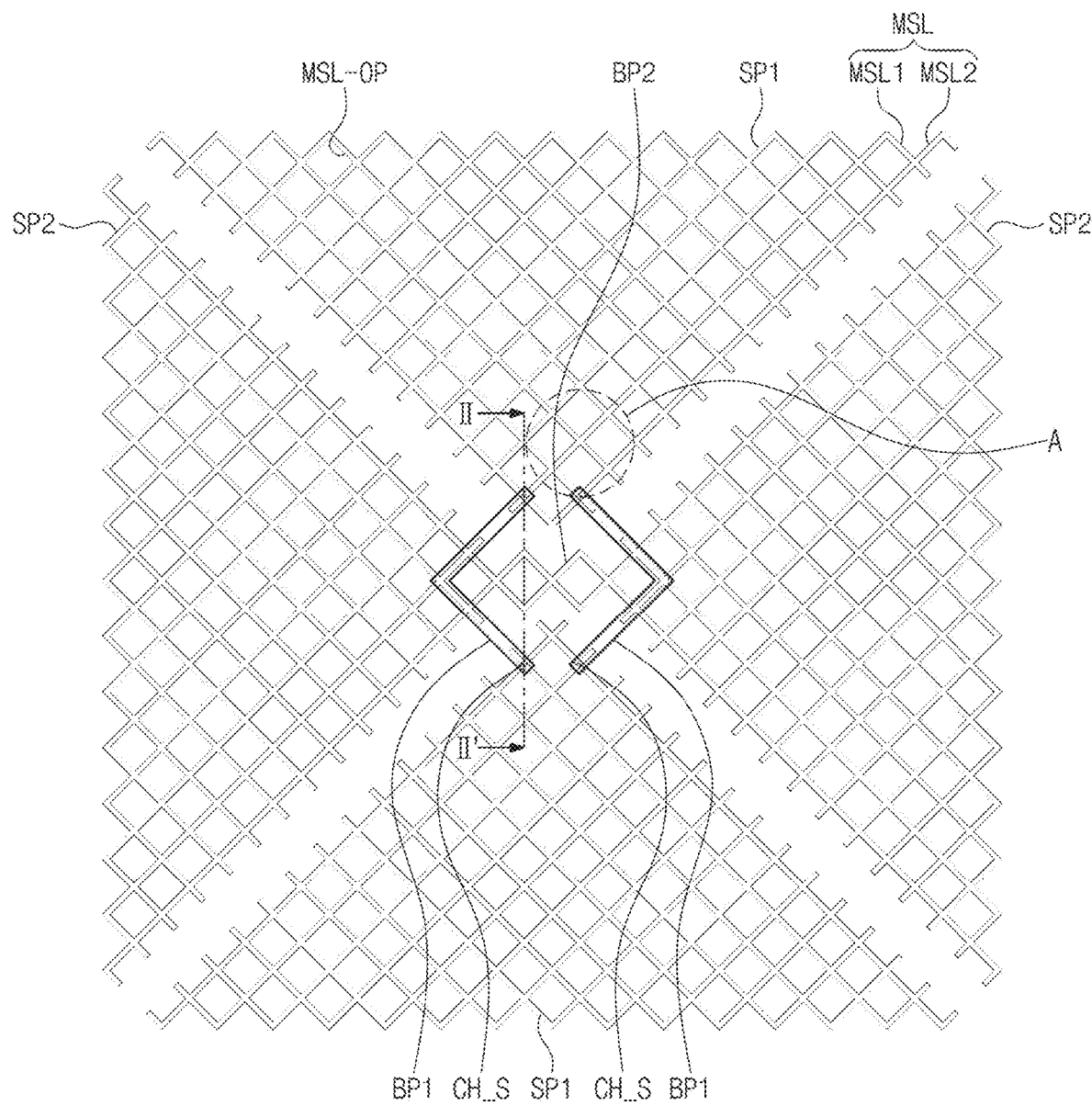
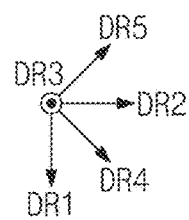

FIG. 9
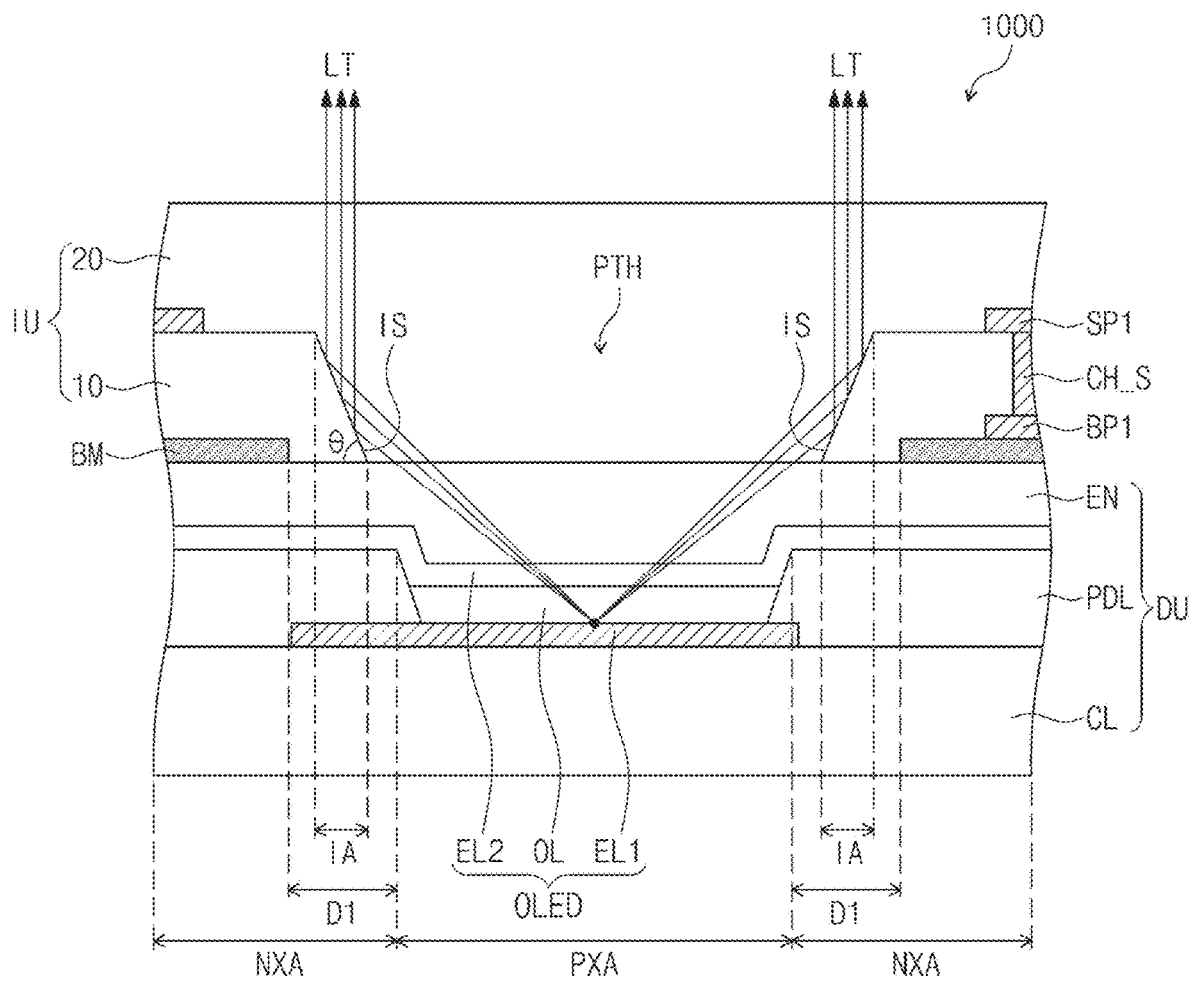
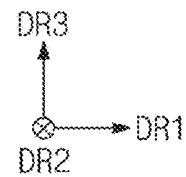

FIG. 12
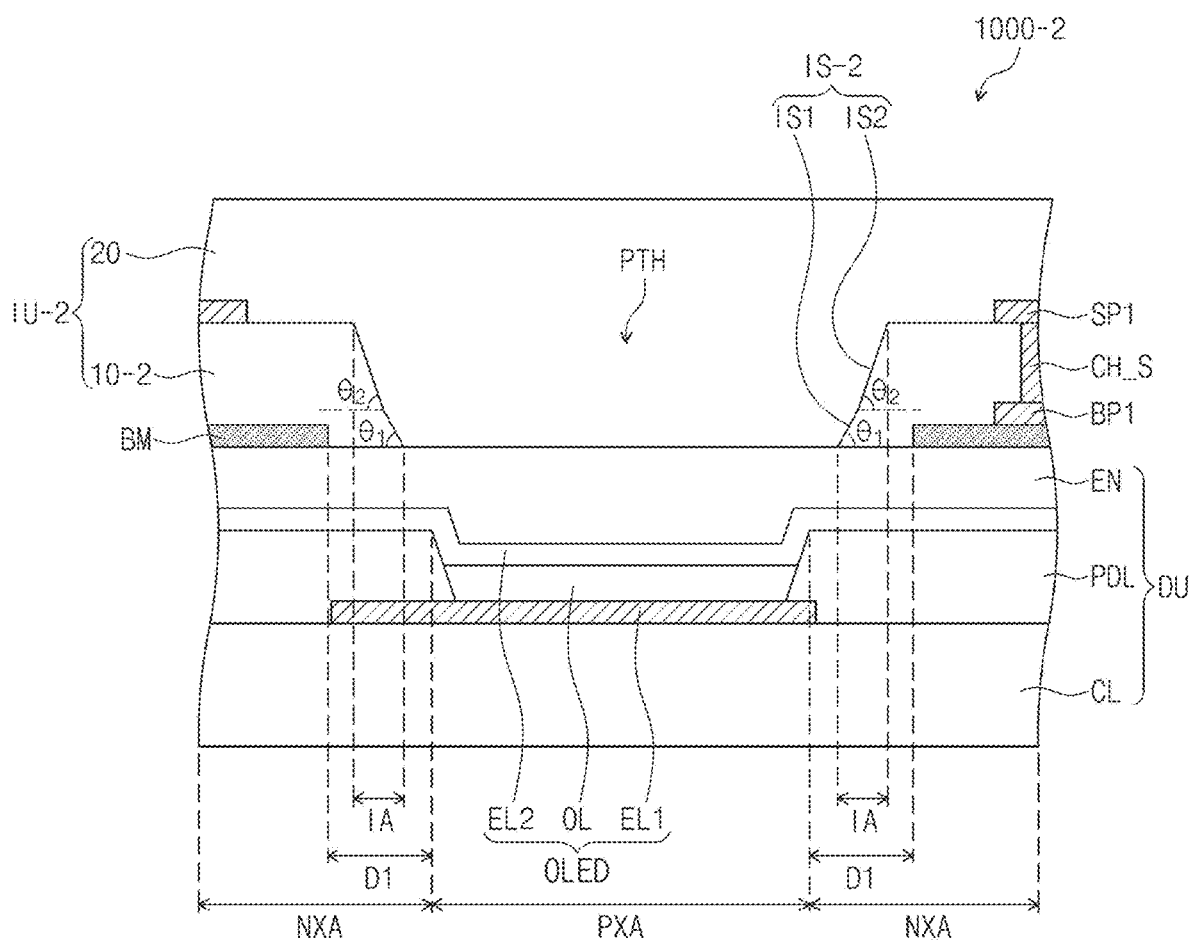
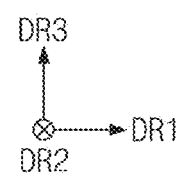

FIG. 14
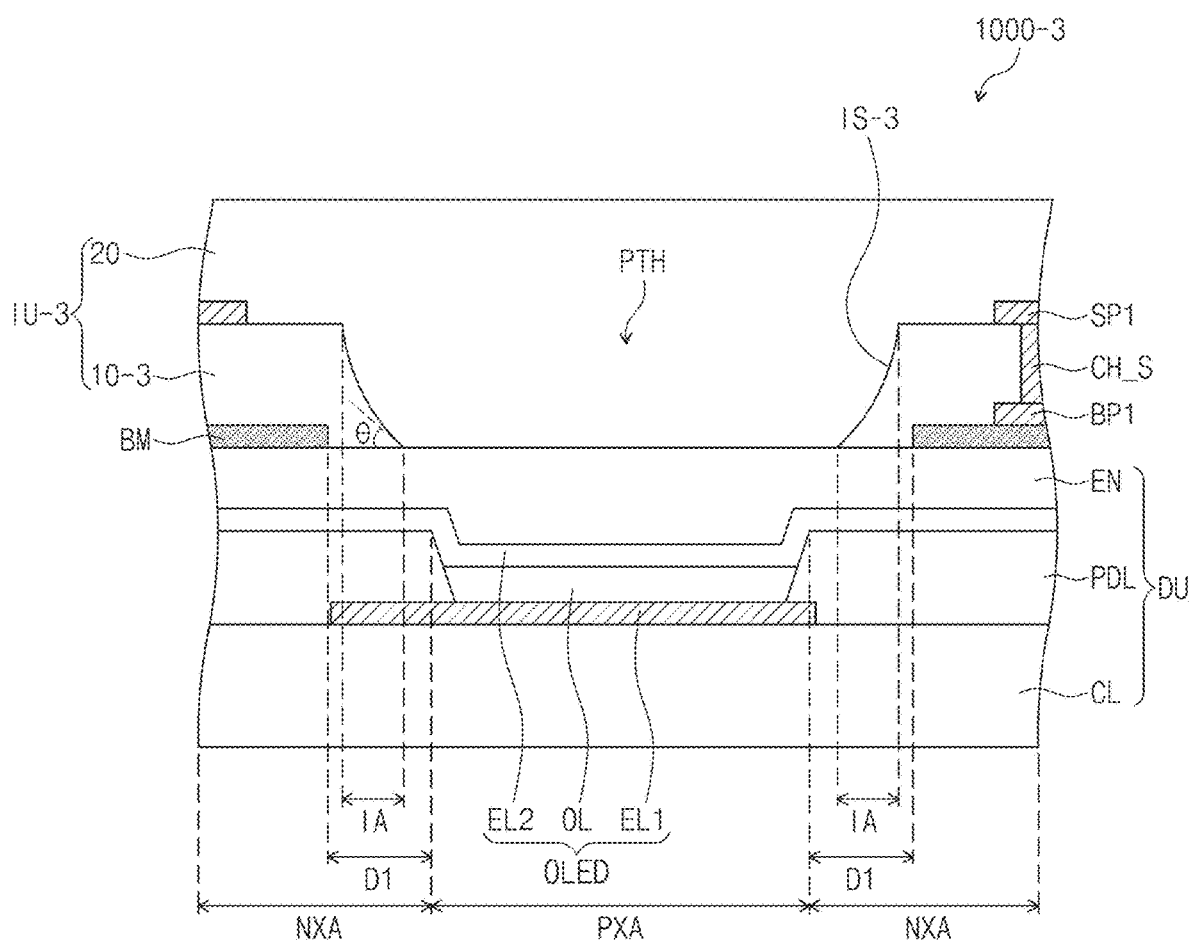
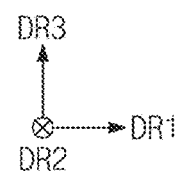

FIG. 18
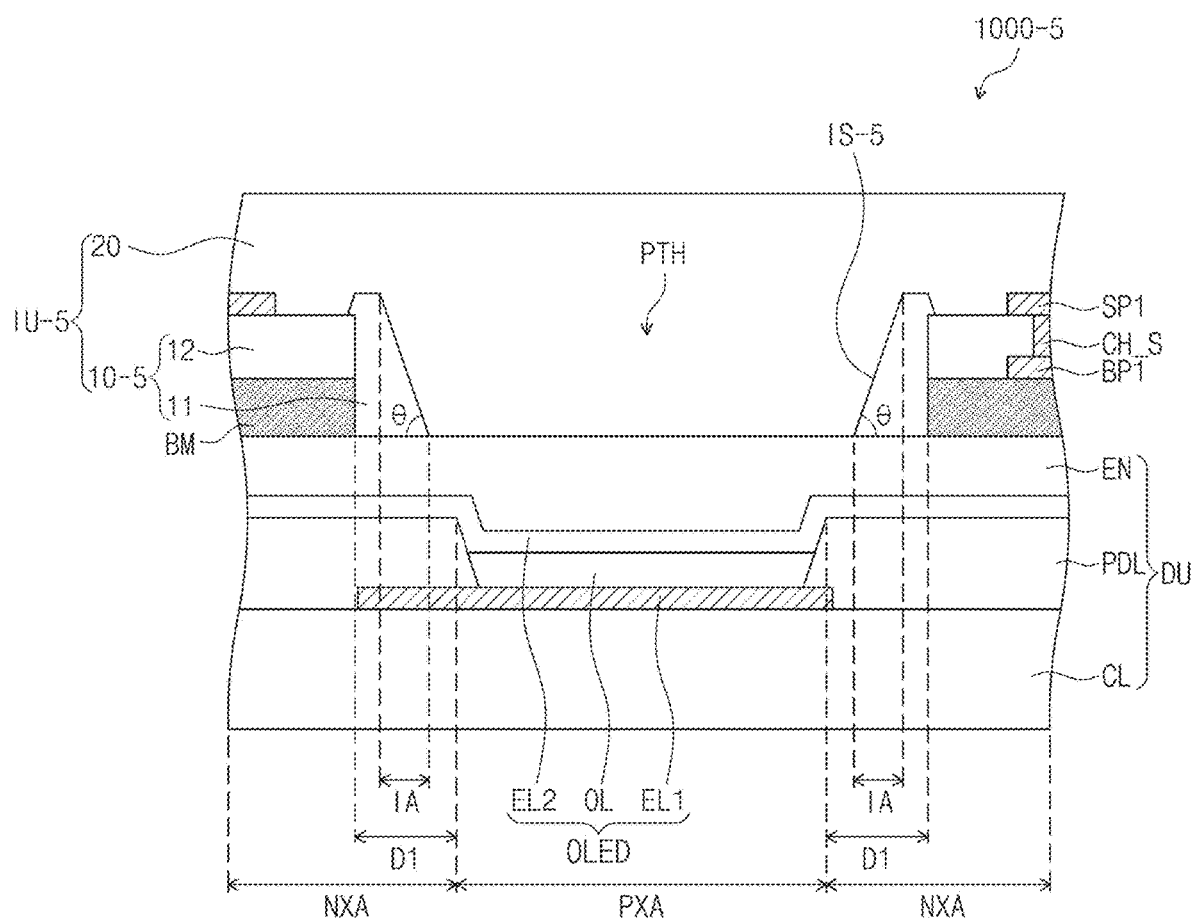
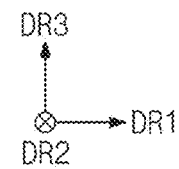

DISPLAY APPARATUS

CROSS-REFERENCE TO RELATED APPLICATIONS

This application is a U.S. National Phase patent application of International Application Number PCT/KR2019/013694, filed on Oct. 17, 2019, which claims priority to Korean Patent Application No. 10-2018-0124229, filed on Oct. 18, 2018, the entire content of each of which is incorporated by reference herein.

TECHNICAL FIELD

Aspects of example embodiments of the present disclosure relate to a display apparatus, and more specifically, to a display apparatus having improved display quality.

BACKGROUND ART

The importance of display apparatuses is increasing with the development of multimedia. Accordingly, various types of display apparatuses, for example, such as a liquid crystal display (LCD) apparatus and an organic light emitting display (OLED) apparatus, have been used.

Among the display apparatuses, the OLED apparatus displays an image by using organic light emitting elements that generate light through recombination of electrons and holes. The OLED apparatus has high response speed, wide viewing angles, and high luminance. Also, the OLED apparatus may be driven with low power consumption.

DISCLOSURE OF THE INVENTION

Technical Problem

One or more example embodiments of the present disclosure are directed to a display apparatus having improved display quality.

Technical Solution

A display apparatus according to an embodiment of the present disclosure includes: a display unit including a plurality of organic light emitting elements, and defining a plurality of light emitting areas and a non-light emitting area surrounding the light emitting areas; and an input sensing unit on the display unit. The input sensing unit includes: a first conductive pattern on the display unit; an insulating layer on the first conductive pattern to cover the first conductive pattern, and defining a plurality of light collecting patterns overlapping with the light emitting areas in a plan view; a second conductive pattern on a top surface of the insulating layer; and an overcoat layer on the second conductive pattern to cover the insulating layer and the second conductive pattern. Each of the light collecting patterns is recessed downward from the top surface of the insulating layer.

A refractive index of the overcoat layer may be greater than a refractive index of the insulating layer.

An inner surface of each of the light collecting patterns may have an inclined surface that may be inclined downward from the top surface of the insulating layer.

Each of the light collecting patterns may define a pattern hole that passes through the insulating layer.

An angle formed between the inclined surface and a bottom surface of the insulating layer may be about 30 degrees to about 70 degrees.

The inclined surface may include: a first inclined surface having a first angle with respect to a bottom surface of the insulating layer; and a second inclined surface connected to the first inclined surface, and having a second angle with respect to the bottom surface of the insulating layer. The first angle may be less than the second angle.

The inclined surface may include a curved surface.

Each of the light collecting patterns may define a pattern groove.

The insulating layer may include an organic material.

The first conductive pattern may include first connection patterns, and the second conductive pattern may include: first sensing patterns connected to each other by the first connection patterns; second sensing patterns insulated from the first sensing patterns; and second connection patterns configured to connect the second sensing patterns to each other.

The first sensing patterns may be arranged in a first direction in a plan view, and the second sensing patterns may be arranged in a second direction crossing the first direction in the plan view. The first connection patterns and the first sensing patterns may be connected to each other to define one first sensing electrode, and the second connection patterns and the second sensing patterns may be connected to each other to define one second sensing electrode. The first sensing electrode may be provided in a plurality and arranged along the second direction, and the second sensing electrode may be provided in a plurality and arranged along the first direction.

A plurality of openings may be defined in the second conductive pattern, the plurality of openings overlapping with the plurality of light emitting areas in a one-to-one correspondence.

The input sensing unit may further include a light blocking layer between the display unit and the insulating layer, the light blocking layer may overlap with the non-light emitting area in a plan view, and the first conductive pattern may be located above the light blocking layer.

A top surface and a side surface of the light blocking layer may be covered by the insulating layer.

A spaced distance between the light blocking layer and each of the light emitting areas may be about 3 µm.

The input sensing unit may further include a cover layer between the light blocking layer and the first conductive pattern to space the light blocking layer and the first conductive pattern from each other, and the cover layer may include an inorganic material.

The insulating layer may include: a first section outside the light blocking layer to cover a side surface of the light blocking layer, the first section including an organic material; and a second section above the light blocking layer and the first conductive pattern to cover a top surface of the light blocking layer and a top surface of the first conductive pattern, the second section including an inorganic material.

A side surface of the first section may include an inclined surface.

A maximum height of the first section may be greater than a maximum height of the second section, and the first section may cover a side surface and a portion of a top surface of the second section.

Each of the organic light emitting elements may include: a first electrode connected to a thin film transistor; a light emitting layer above the first electrode to overlap with one of the light emitting areas; and a second electrode configured to cover the light emitting layer.

A display apparatus according to an embodiment of the present disclosure includes: a display unit including a plurality of organic light emitting elements, and defining a plurality of light emitting areas and a non-light emitting area surrounding the light emitting areas; and an input sensing unit on the display unit. The input sensing unit includes: a plurality of conductive patterns defining a plurality of openings that overlap with the light emitting areas, respectively; an insulating layer configured to insulate at least a portion of the plurality of conductive patterns; and an overcoat layer above the insulating layer and covering the plurality of conductive patterns. The overcoat layer includes a plurality of protrusion patterns at areas overlapping with the light emitting areas, the protrusion patterns protruding downward from a bottom surface of the overcoat layer.

A display apparatus according to an embodiment of the present disclosure includes: a display unit including a plurality of organic light emitting elements, and defining a plurality of light emitting areas; and an input sensing unit on the display unit. The input sensing unit includes: a first conductive pattern on the display unit; an insulating layer on the first conductive pattern to cover the first conductive pattern; a second conductive pattern on the insulating layer; and an overcoat layer on the second conductive pattern to cover the insulating layer and the second conductive pattern. A plurality of pattern holes overlapping with the light emitting areas in a one-to-one correspondence are defined in the insulating layer, the plurality of pattern holes including an inner side surface that is inclined.

Advantageous Effects

According to one or more example embodiments of the present disclosure, the optical efficiency of the display apparatus may be increased. According to one or more example embodiments of the present disclosure, the contrast ratio of the display apparatus may be improved. In other words, according to one or more example embodiments of the present disclosure, the display quality of the display apparatus may be improved.

BRIEF DESCRIPTION OF THE DRAWINGS

The above and other aspects and features of the present disclosure will become more apparent to those skilled in the art from the following detailed description of the example embodiments with reference to the accompanying drawings.

FIG. 5 is an enlarged view of a portion of regions illustrated in FIG. 4.

FIG. 9 is a view illustrating an optical path of light provided from an organic light emitting element.

FIG. 12 is an enlarged view of a portion of an insulating layer illustrated in FIG. 11.

FIG. 14 is an enlarged view of a portion of an insulating layer illustrated in FIG. 13.

FIG. 18 is an enlarged view of a portion of an insulating layer illustrated in FIG. 17.

MODE FOR CARRYING OUT THE INVENTION

Figure 1:
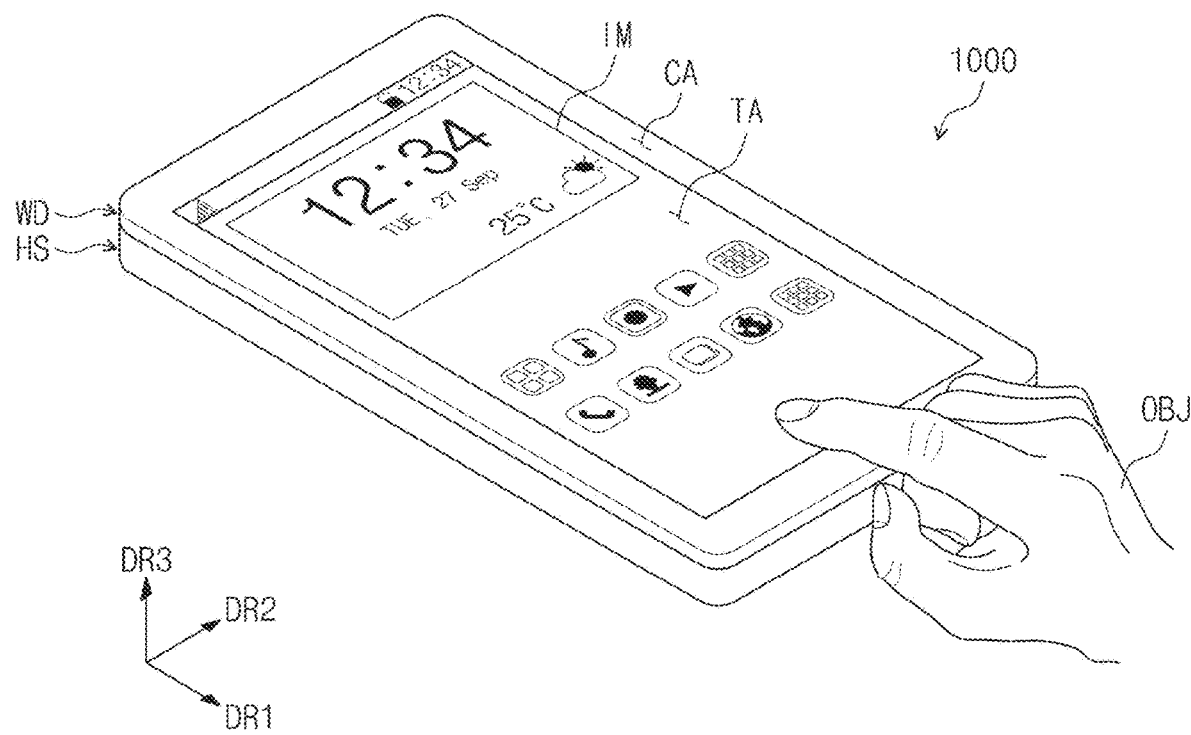
FIG. 1 is a perspective view of a display apparatus according to an embodiment of the present disclosure.

As used in this specification, when an element (or a region, a layer, a portion, or the like) is referred to as "being on", "being connected to", or "being coupled to" another element, it may be directly disposed/connected/coupled to the other element, or an intervening third element may be disposed therebetween.

Like reference symbols refer to like elements throughout. Also, in the drawings, the thicknesses, ratios, and dimensions of the elements may be exaggerated for effective description of the technical contents.

"And/or" includes one or more combinations which may be defined by the associated elements.

It will be understood that, although the terms first, second, etc., may be used herein to describe various elements, these elements should not be limited by these terms. These terms are used to distinguish one element from another element. For example, a first element may be referred to as a second element, and similarly, a second element may be referred to as a first element, without departing from the scope of the present disclosure. The singular forms include the plural forms unless the context clearly indicates otherwise.

Also, terms such as "below", "lower", "above", "upper", and the like may be used to describe the relationships of the components illustrated in the drawings. These terms have a relative concept, and are described on the basis of the directions indicated in the drawings.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art, and should not be interpreted in an idealized or overly formal sense unless expressly so defined herein.

It will be understood that the terms "includes" or "comprises", when used in this specification, specify the presence of the stated features, integers, steps, operations, elements, components, or a combination thereof, but do not preclude the presence or addition of one or more other features, integers, steps, operations, elements, components, or combinations thereof.

Hereinafter, example embodiments of the present disclosure will be described in more detail with reference to the accompanying drawings.

Figure 2:
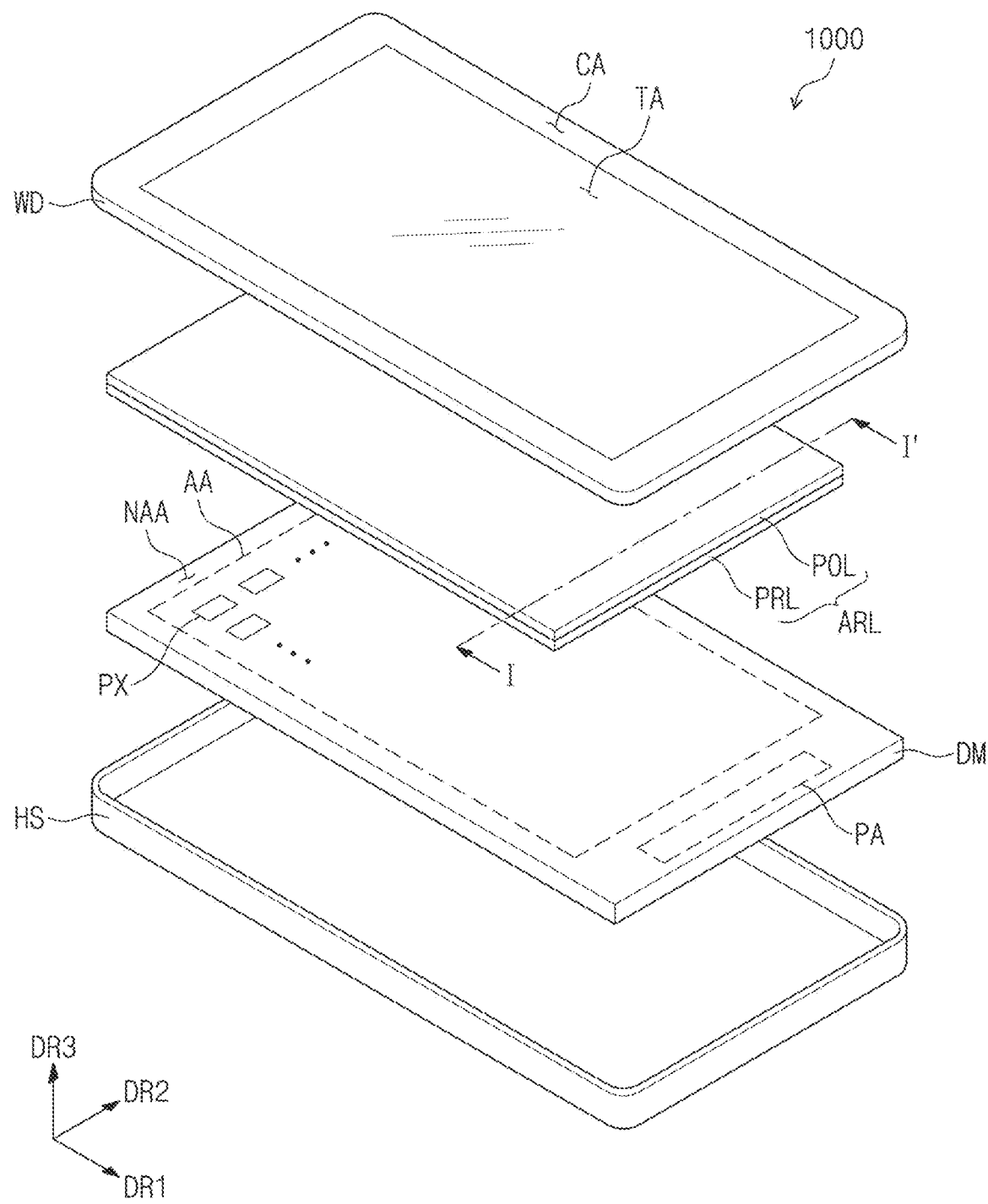
FIG. 2 is an exploded perspective view of a display apparatus illustrated in FIG. 1.
Figure 3:
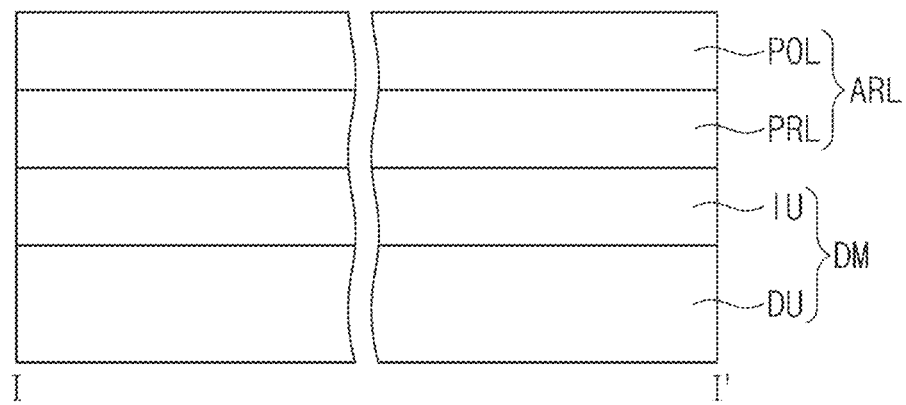
FIG. 3 is a cross-sectional view taken along the line I-I' of FIG. 2.

FIG. 1 is a perspective view of a display apparatus according to an embodiment of the present disclosure, and FIG. 2 is an exploded perspective view of the display apparatus illustrated in FIG. 1. FIG. 3 is a cross-sectional view taken along the line I-I' of FIG. 2.

Referring to FIGS. 1 to 3, a display apparatus 1000 according to an embodiment of the present disclosure may have a hexahedral shape that has a thickness in a third direction DR3 on a plane defined by first and second directions DR1 and DR2 that cross each other. However, this is merely provided as an example, and the display apparatus 1000 may have various suitable shapes and is not limited to one particular embodiment.

In the present embodiment, the display apparatus 1000 provides a display surface that is parallel to or substantially parallel to each of the first direction DR1 and the second direction DR2, and through which an image IM is displayed in the third direction DR3. The display surface on which the image IM is displayed may correspond to a front surface of the display apparatus 1000.

For convenience of description, a direction in which the image IM is provided from the display apparatus 1000 is defined as an upward direction, and a direction opposite to the upward direction is defined as a downward direction. In the present embodiment, the upward and downward directions are parallel to or substantially parallel to the third direction DR3, which is defined as a direction perpendicular to or substantially perpendicular to the first direction DR1 and the second direction DR2. The third direction DR3 may be a reference direction that distinguishes a front surface and a rear surface of each component described in more detail below. However, the upward direction and the downward direction may be relative concepts, and thus, may be variously modified into other suitable directions.

The front surface of the display apparatus 1000 may be divided into a light transmitting area TA and a light blocking area CA. The light transmitting area TA may be defined as an area through which the image IM is transmitted. The image IM may be viewed through the light transmitting area TA by a user.

The light blocking area CA is adjacent to the light transmitting area TA. The light blocking area CA may have a suitable color (e.g., a predetermined color). The shape of the light transmitting area TA may be substantially defined by the light blocking area CA.

According to another embodiment of the present disclosure, the display apparatus 1000 may include only the light transmitting area TA. In other words, the light blocking area CA may be omitted or reduced. In this case, an image IM may be transmitted through an entire top surface of the display apparatus 1000.

The display apparatus 1000 may sense an input signal applied from the outside. The input signal may include various suitable types of inputs provided from the outside of the display apparatus 1000. For example, the input signal includes various suitable types of external inputs such as a portion of the body of a user, light, heat, pressure, and/or the like. In the present embodiment, the input signal may be a touch signal. Also, the display apparatus 1000 may sense an input signal that is approaching (e.g., that is proximal to) the display apparatus 1000 as well as an input signal that is in contact with the display apparatus 1000.

The display apparatus 1000 may sense the input signal applied to the light transmitting area TA, but may not sense an input signal applied to the light blocking area CA. As another example, the display apparatus 1000 may sense the input signal applied to the light blocking area CA, but may not sense the input signal applied to the light transmitting area TA. In another example, the display apparatus 1000 may sense the input signal applied to the entire surface of the display apparatus 1000 including both the light transmitting area TA and the light blocking area CA. The display apparatus 1000 according to an embodiment of the present disclosure may sense the input signal applied to various suitable areas depending on the design for an internal configuration, and is not limited to one particular embodiment.

FIG. 1 illustratively shows a case where the input signal is a hand OBJ that is a body part of the user. However, this is merely illustrated as an example, and the display apparatus according to another embodiment of the present disclosure may sense various suitable types of input signals, and is not limited to one particular embodiment.

The display apparatus 1000 includes a window member WD, an anti-reflection member ARL, a display member DM, and an accommodation member HS.

For convenience of illustration, FIGS. 1 and 2 illustrate a portion of some components of the display apparatus 1000. In addition to the members illustrated in the drawings, the display apparatus 1000 may further include various suitable components, for example, such as a power supply module (e.g., a power supply), an optical member, a protective member, a heat dissipating member, and an electronic module (e.g., an electronic device) that includes various suitable electronic elements.

The window member WD provides the front surface of the display apparatus 1000, and protects the anti-reflection member ARL and the display member DM. For example, the window member WD may include a glass substrate, a sapphire substrate, and/or a plastic film. The window member WD may have a multilayered structure or a single layer structure. For example, the window member WD may have a stacked structure in which a plurality of plastic films are connected to each other by an adhesive, or a stacked structure in which a glass substrate is connected to a plastic film by an adhesive.

The display member DM is disposed below (e.g., underneath) the window member WD. The display member DM may be divided into an active area AA, a pad area PA, and a peripheral area NAA when viewed in a plan view (e.g., when viewed from a plane that is parallel to or substantially parallel to a surface of the display member DM). The display member DM includes an input sensing unit (e.g., an input sensing layer or an input sensing panel) IU and a display unit (e.g., a display layer or a display panel) DU. The input sensing unit IU may be disposed on the display unit DU.

The active area AA may be an area at (e.g., in or on) which the input signal is sensed. The input sensing unit IU may include a plurality of sensing electrodes that are disposed on the active area AA, and that sense the input signal. This will be described in more detail below. The active area AA displays the image IM. Accordingly, the display unit DU may include a plurality of pixels PX that are disposed at (e.g., in or on) the active area AA, and that display light rays that generate the image IM. The pixels PX may be arranged in a matrix form within the active area AA. The pixels PX display the light rays in response to an electrical signal. This will be described in more detail below.

The pad area PA may be disposed adjacent to one side of the active area AA. A plurality of pads may be disposed at (e.g., in or on) the pad area PA. The pad area PA may be an area connected to a circuit board. The display member DM may be electrically connected to an external element via the pad area PA.

A single pad area PA is illustrated in the embodiment of FIGS. 1 and 2 for convenience of illustration. However, a display member DM according to another embodiment of the present disclosure may include a plurality of pad areas. Also, a plurality of different electrical signals may be applied to the single pad area PA, and different electrical signals may be applied to the plurality of pad areas.

The plurality of pad areas may be provided on different layers from each other, or may be provided at (e.g., in or on) the same layer as each other. The display member DM according to an embodiment of the present disclosure may have various pad areas PA, and is not limited to one particular embodiment. One or more example embodiments of the present disclosure illustratively show a case where the pad area PA is an area for transmitting and receiving the input signal sensed at (e.g., in or on) the active area AA.

Also, FIG. 2 illustrates a case where the display member DM is rigid, but in another embodiment of the present disclosure, a display member DM may be flexible, such that a pad area PA thereof may be bent and positioned below an active area AA thereof. In this case, a dead space may be reduced.

The peripheral area NAA is adjacent to the active area AA and the pad area PA. In the present embodiment, the peripheral area NAA may surround (e.g., around a periphery of) each of the active area AA and the pad area PA.

The display member DM will be described in more detail below with reference to FIGS. 5 to 8.

The anti-reflection member ARL may be disposed between the window member WD and the display member DM. The anti-reflection member ARL may be disposed to overlap with the active area AA of the display member DM when viewed in a plan view. According to the present embodiment, an area of the anti-reflection member ARL may be less than (e.g., may be smaller than) an area of the display member DM when viewed in a plan view.

The anti-reflection member ARL has a role in preventing or substantially preventing external light, which is incident on the display apparatus 1000 from the outside, from being reflected from the display member DM and viewed by a user. For example, the anti-reflection member ARL may include a polarizing layer POL and a phase delay layer PRL.

The polarizing layer POL is disposed below (e.g., underneath) the window member WD. The polarizing layer POL has a transmitting axis, and an absorbing axis crossing the transmitting axis. In the present embodiment, the transmitting axis and the absorbing axis are perpendicular to or substantially perpendicular to each other. Thus, one component of the components of the external light incident to the polarizing layer POL is absorbed by the absorbing axis or reflected therefrom, and thus, does not pass through the polarizing layer POL. Also, from among the components of the external light incident to the polarizing layer POL, a component perpendicular to or substantially perpendicular to the one component passes through the polarizing layer POL. Thus, the polarizing layer POL linearly polarizes the external light.

The polarizing layer POL may be made of a polymer resin elongated in a suitable or predetermined direction (e.g., in a specific direction). However, the type of the polarizing layer POL of the present disclosure is not limited thereto. For example, according to another embodiment of the present disclosure, the polarizing layer POL may be a wire grid polarizer.

Also, according to another embodiment of the present disclosure, the anti-reflection member ARL may further include support bodies disposed above and/or below the polarizing layer POL. The support bodies may support the polarizing layer POL, and may prevent or substantially prevent contamination from the outside, and may protect or substantially protect the display member DM from an impact from the outside.

The phase delay layer PRL may be disposed below (e.g., underneath) the polarizing layer POL. The phase delay layer PRL may have an optical anisotropy. Thus, the phase delay layer PRL may delay one component of the incident light. In other words, the phase delay layer PRL may have a role in changing a polarization state of the light. For example, the phase delay layer PRL may delay one component of the incident light by a quarter wavelength ($\lambda/4$). In other words, the phase delay layer PRL may be a quarter wave film. Thus, a phase of one component of the light, which passes through the phase delay layer PRL, may be delayed, and thus, may be changed from a linearly polarized state to a circularly polarized state, or may be changed from the circularly polarized state to the linearly polarized state.

The phase delay layer PRL may include one or more of polycarbonate (PC)-based resin, cyclo-olefin polymer (COP)-based resin, acryl-based resin, or cellulose-based resin. However, the present disclosure is not particularly limited to a material of the phase delay layer PRL. For example, according to another embodiment of the present disclosure, the phase delay layer PRL may include liquid crystals.

Consequently, the external light incident to the polarizing layer POL is linearly polarized and then incident to the phase delay layer PRL, and as the light passes through the phase delay layer PRL, the light is circularly polarized. The circularly polarized external light may be reflected by the display member DM, and at this moment, a polarization direction of the external light may change. For example, the external light, which is incident to the display member DM in a left-circularly polarized state, may be reflected from the display member DM, and thus, changes to a right-circularly polarized state, and the external light, which is incident to the display member DM in a right-circularly polarized state, may be reflected from the display member DM, and thus, changes to a left-circularly polarized state.

The reflected light, of which the polarization direction has changed, is incident again to the phase delay layer PRL, and a phase of one component thereof may be delayed by the phase delay layer PRL and changed from the circularly polarized state to the linearly polarized state. The linear polarization direction of the reflected light may be parallel to or substantially parallel to the absorbing axis of the polarizing layer POL. Thus, the linearly polarized reflected light may be absorbed by the polarizing layer POL.

The accommodation member HS is disposed on the rear surface of the display member DM. The accommodation member HS may be connected to the window member WD to provide a rear surface of the display apparatus 1000. The accommodation member HS is connected to the window member WD to define an inner space, and the inner space accommodates the anti-reflection member ARL, the display member DM, and various electronic components and optical components that are not shown.

The accommodation member HS may include a material having a relatively high strength. For example, the accommodation member HS may include a plurality of frames and/or plates made of glass, plastics, and/or metal. The accommodation member HS may stably protect the components of the display apparatus 1000, which are accommodated in the inner space, against external impacts.

Figure 4:
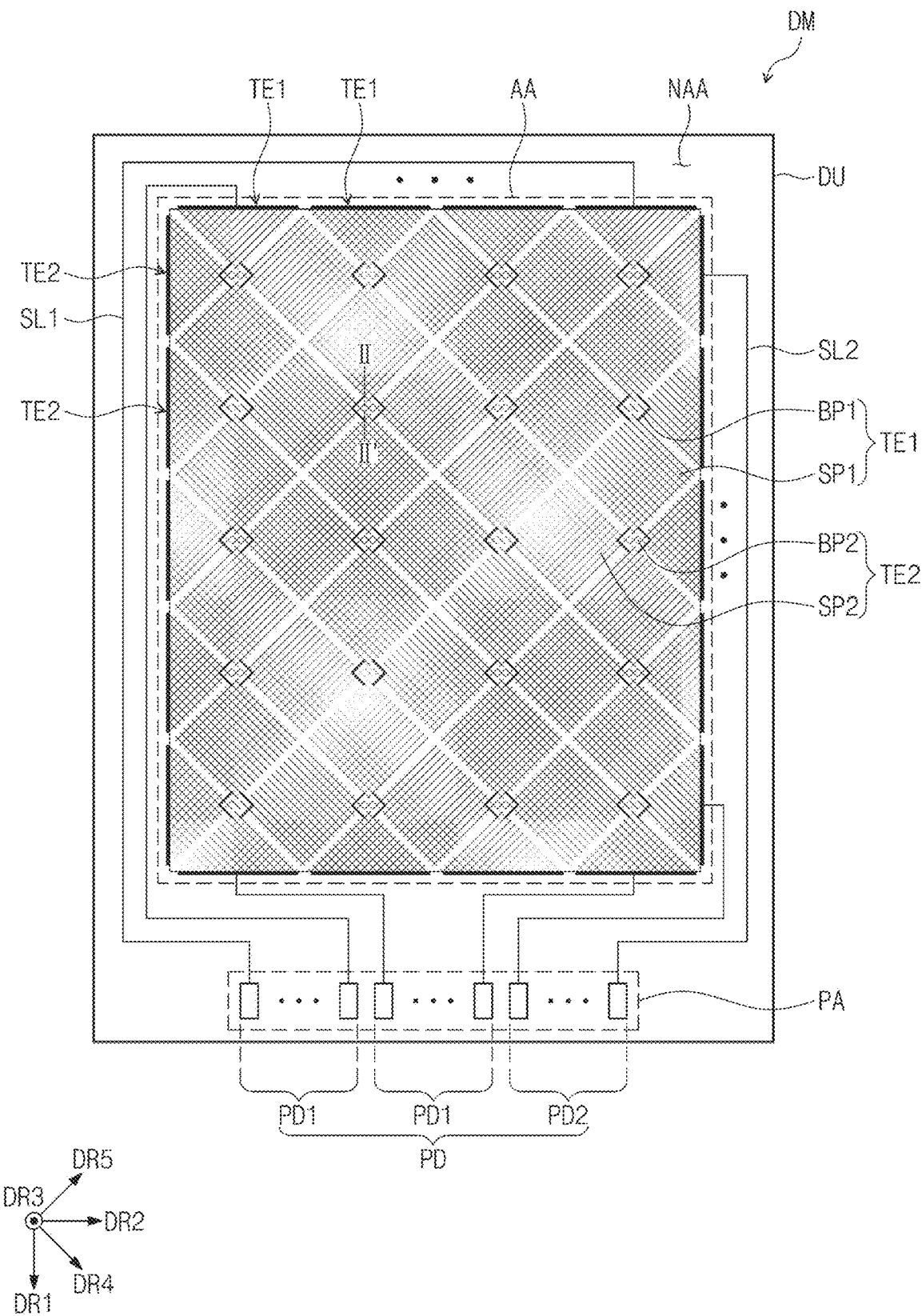
FIG. 4 is a plan view of a display member illustrated in FIG. 2.
Figure 6:
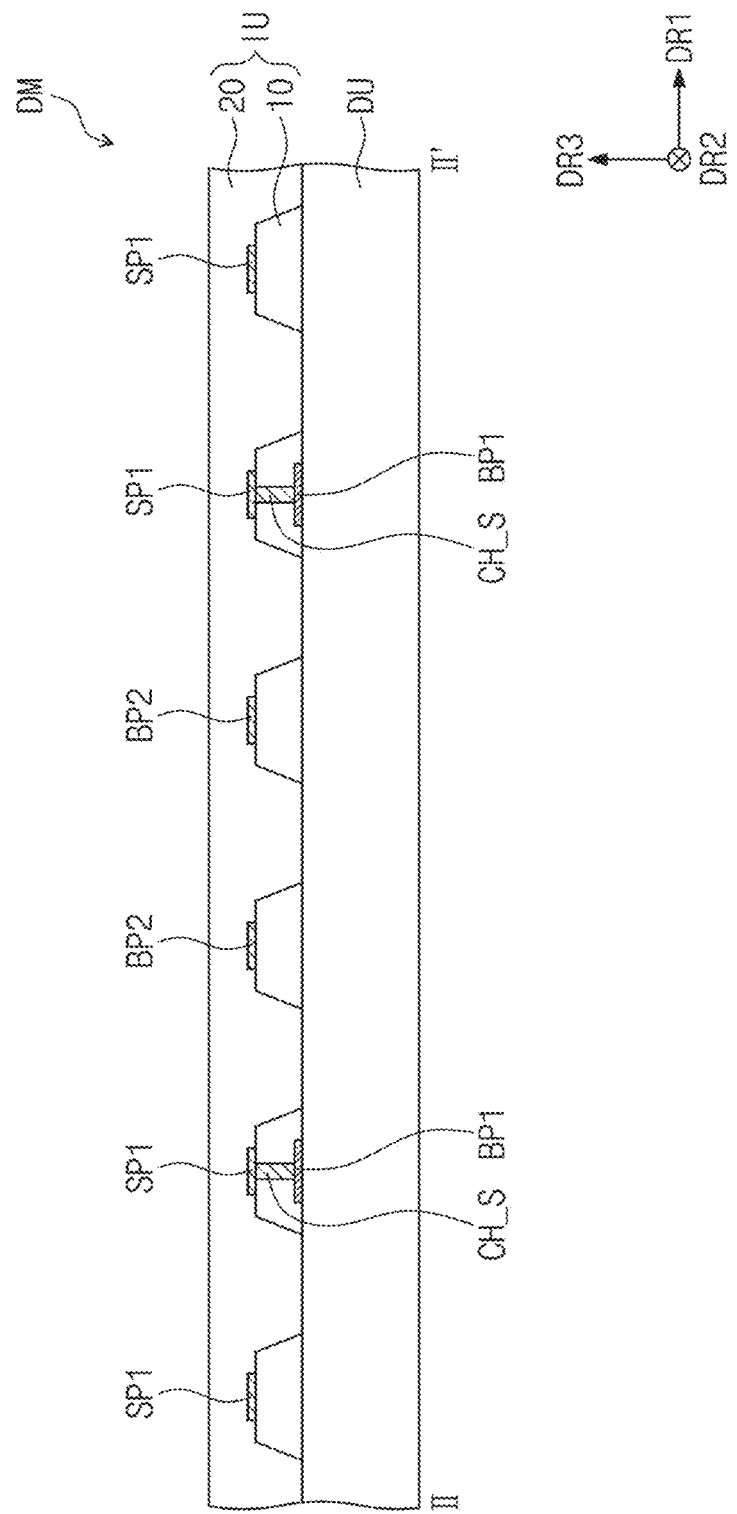
FIG. 6 is a cross-sectional view taken along the line II-II' of FIG. 5.

FIG. 4 is a plan view of the display member illustrated in FIG. 2, and FIG. 5 is an enlarged view of a portion of regions illustrated in FIG. 4. FIG. 6 is a cross-sectional view taken along the line II-II' of FIG. 5.

As described above, the input sensing unit IU may be disposed on the display unit DU. Referring to FIGS. 4 to 6, the input sensing unit IU may include a first sensing electrode TE1, a second sensing electrode TE2, a first signal line SL1, a second signal line SL2, and pads PD, which are arranged in a plane. The first sensing electrode TE1, the second sensing electrode TE2, the first signal line SL1, the second signal line SL2, and the pads PD have a conductivity.

The first sensing electrode TE1 extends in the first direction DR1. The first sensing electrode TE1 may be provided in a plurality, and arranged along the second direction DR2.

The second sensing electrode TE2 may be disposed to be insulated from the first sensing electrode TE1. The second sensing electrode TE2 extends in the second direction DR2. The second sensing electrode TE2 may be provided in a plurality, and arranged along the first direction DR1.

The input sensing unit IU may sense an external input signal by sensing a change in a mutual capacitance between the first sensing electrode TE1 and the second sensing electrode TE2, or may sense an external input signal by sensing a change in a self-capacitance of each of the first sensing electrode TE1 and the second sensing electrode TE2. The input sensing unit IU according to an embodiment of the present disclosure may sense an external input signal through various suitable methods, and is not limited to one particular embodiment.

The first signal line SL1 is provided in a plurality, and connected to the first sensing electrodes TE1. The first signal lines SL1 are disposed at (e.g., in or on) the peripheral area NAA, and thus, may be invisible from the outside (e.g., may not be viewable from the outside). The second signal line SL2 is provided in a plurality, and connected to the second sensing electrodes TE2. The second signal lines SL2 are disposed at (e.g., in or on) the peripheral area NAA, and thus, may be invisible from the outside (e.g., may not be viewable from the outside).

In the present embodiment, one first sensing electrode TE1 may be connected to two first signal lines SL1. In this case, one end and the other end (e.g., an opposite end) of one first sensing electrode TE1 may be connected to two first signal lines SL1 that are different from each other, and may be connected to two first pads PD1. Accordingly, even though the first sensing electrode TE1 may be relatively longer than the second sensing electrode TE2, electrical signals may be uniformly applied over the entire area.

Thus, regardless of the shape, the input sensing unit IU may provide a uniform touch sensing environment to the entirety of the active area AA. However, the present disclosure is not particularly limited to a particular connection relationship between the signal lines and the pads. The input sensing unit IU according to an embodiment of the present disclosure may be driven by various suitable methods, and is not limited to one particular embodiment.

The pads PD may include a first pad PD1 and a second pad PD2. As described above, each of the pads PD may be connected to the first signal line SL1 or the second signal line SL2, and thus, may be electrically connected to the first sensing electrode TE1 or the second sensing electrode TE2.

According to the present embodiment, the first sensing electrode TE1 includes a plurality of first sensing patterns SP1, and a plurality of first connection patterns BP1. The first sensing patterns SP1 may be arranged to be spaced apart from each other in the first direction DR1. The first connection patterns BP1 are disposed between the first sensing patterns SP1 to connect neighboring first sensing patterns SP1 (e.g., to connect adjacent ones of the first sensing patterns SP1) to each other.

The second sensing electrode TE2 includes a plurality of second sensing patterns SP2, and a plurality of second connection patterns BP2. The second sensing patterns SP2 may be arranged to be spaced apart from each other in the second direction DR2. The second connection patterns BP2 are disposed between the second sensing patterns SP2 to connect neighboring second sensing patterns SP2 (e.g., to connect adjacent ones of the second sensing patterns SP2) to each other. In the present embodiment, the second sensing patterns SP2 and the second connection patterns BP2 may be formed integrally with each other.

According to the present embodiment, one of the first connection patterns BP1 or the second connection patterns BP2 may be disposed at (e.g., in or on) a layer that is different from those of the first sensing patterns SP1 and the second sensing patterns SP2.

For example, the first connection patterns BP1 may be defined as a first conductive pattern, and the first sensing patterns SP1, the second sensing patterns SP2, and the second connection patterns BP2 may be defined as a second conductive pattern. The first conductive pattern and the second conductive pattern may be disposed at (e.g., in or on) different layers from each other. In other words, the first sensing patterns SP1 may be disposed at (e.g., in or on) the same layer as those of the second sensing patterns SP2 and the second connection patterns BP2, but may be disposed at (e.g., in or on) a layer different from that of the first connection patterns BP1.

According to an embodiment, each of the first connection patterns BP1 and the second connection patterns BP2 may be disposed below the first sensing patterns SP1 and the second sensing patterns SP2. In other words, the input sensing unit IU according to the present embodiment may be a lower bridge electrode type. However, the present disclosure is not limited thereto. For example, an input sensing unit IU according to another embodiment of the present disclosure may have an upper bridge electrode type in which one of the first connection patterns BP1 or the second connection patterns BP2 are disposed above the first sensing patterns SP1 and the second sensing patterns SP2.

Also, the present disclosure is not particularly limited to a type of the connection pattern disposed below the first and second sensing patterns SP1 and SP2. According to another embodiment of the present disclosure, the second connection patterns BP2 may be defined as the first conductive pattern, and the first sensing patterns SP1, the second sensing patterns SP2, and the first connection patterns BP1 may be defined as the second conductive pattern.

The input sensing unit IU further includes an insulating layer 10, and an overcoat layer 20. Hereinafter, an arrangement relationship of the insulating layer 10, the overcoat layer 20, the first conductive pattern, and the second conductive pattern will be described in more detail.

The first conductive pattern is disposed on the display unit DU. In other words, the first connection patterns BP1 are disposed on the display unit DU.

The insulating layer 10 is disposed on the first conductive pattern to cover the first connection pattern BP1. The insulating layer 10 according to the present embodiment may include an organic material. The insulating layer 10 has a first refractive index. For example, the first refractive index may be about 1.3 to about 1.55.

The second conductive pattern is disposed on the insulating layer 10. In other words, the first sensing patterns SP1 of the first sensing electrode TE1, the second sensing patterns SP2 of the second sensing electrode TE2, and the second connection patterns BP2 of the second sensing electrode TE2 are disposed on the insulating layer 10.

The first connection patterns BP1 may be connected to the first sensing patterns SP1 from among the second conductive pattern SP1, SP2, and BP2 via a connection contact hole CH_S that is formed to pass through (e.g., to penetrate) the insulating layer 10.

Each of the first sensing patterns SP1, the second sensing patterns SP2, and the second connection patterns BP2, which defines the second conductive pattern SP1, SP2, and BP2, may include a plurality of mesh lines MSL. The mesh lines MSL may include first mesh lines MSL1 that extend in a fourth direction DR4, and second mesh lines MSL2 that extend in a fifth direction DR5 and cross the first mesh lines MSL1. Openings (e.g., predetermined openings) MSL-OP may be defined by the first mesh lines MSL1 and the second mesh lines MSL2.

According to an embodiment of the present disclosure, a plurality of light collecting patterns, which are recessed downward from the top surface of the insulating layer 10, may be formed in regions (e.g., in predetermined regions) on the insulating layer 10. When viewed in a plan view, the light collecting patterns overlap with the openings MSL-OP, and do not overlap with the first and second conductive patterns BP1 and SP1, SP2, and BP2.

The overcoat layer 20 is disposed on the second conductive pattern SP1, SP2, and BP2 to cover the insulating layer 10 and the second conductive pattern SP1, SP2, and BP2. The overcoat layer 20 may prevent or substantially prevent the second conductive pattern SP1, SP2, and BP2 from being exposed to external moisture and/or air. Also, the overcoat layer 20 may function as a planarization layer. The overcoat layer 20 may include an organic material and/or an inorganic material. The overcoat layer 20 has a second refractive index. In the present embodiment, the second refractive index is higher than the first refractive index. For example, the second refractive index may be about 1.55 to about 1.7.

Figure 7:
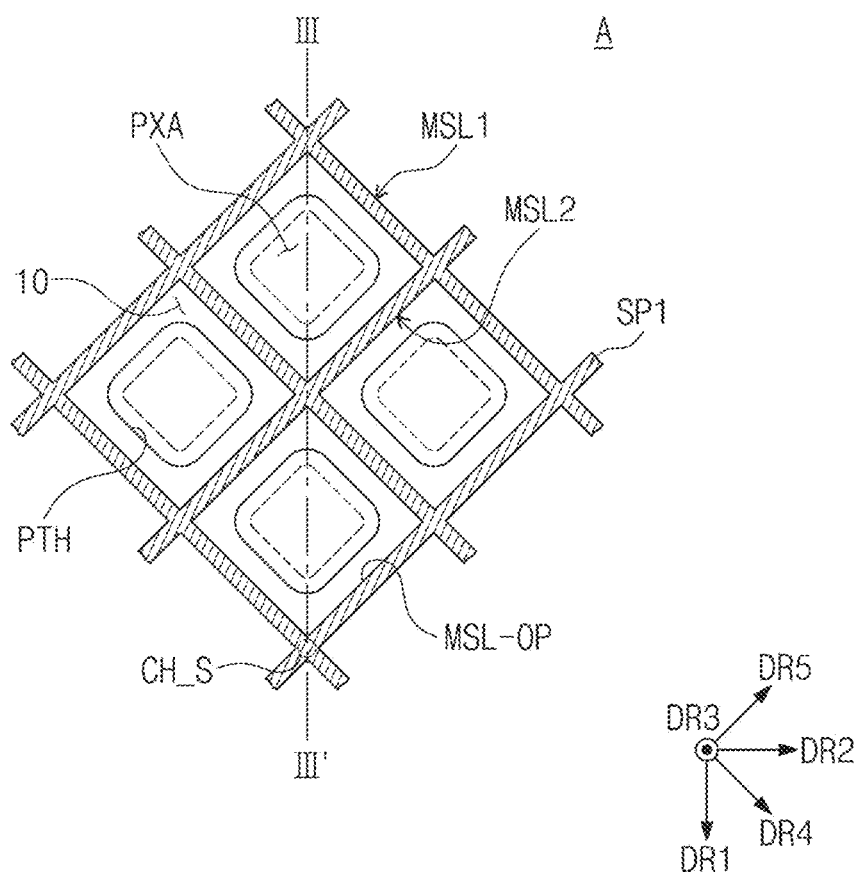
FIG. 7 is an enlarged view of the region A illustrated in FIG. 5.
Figure 8:
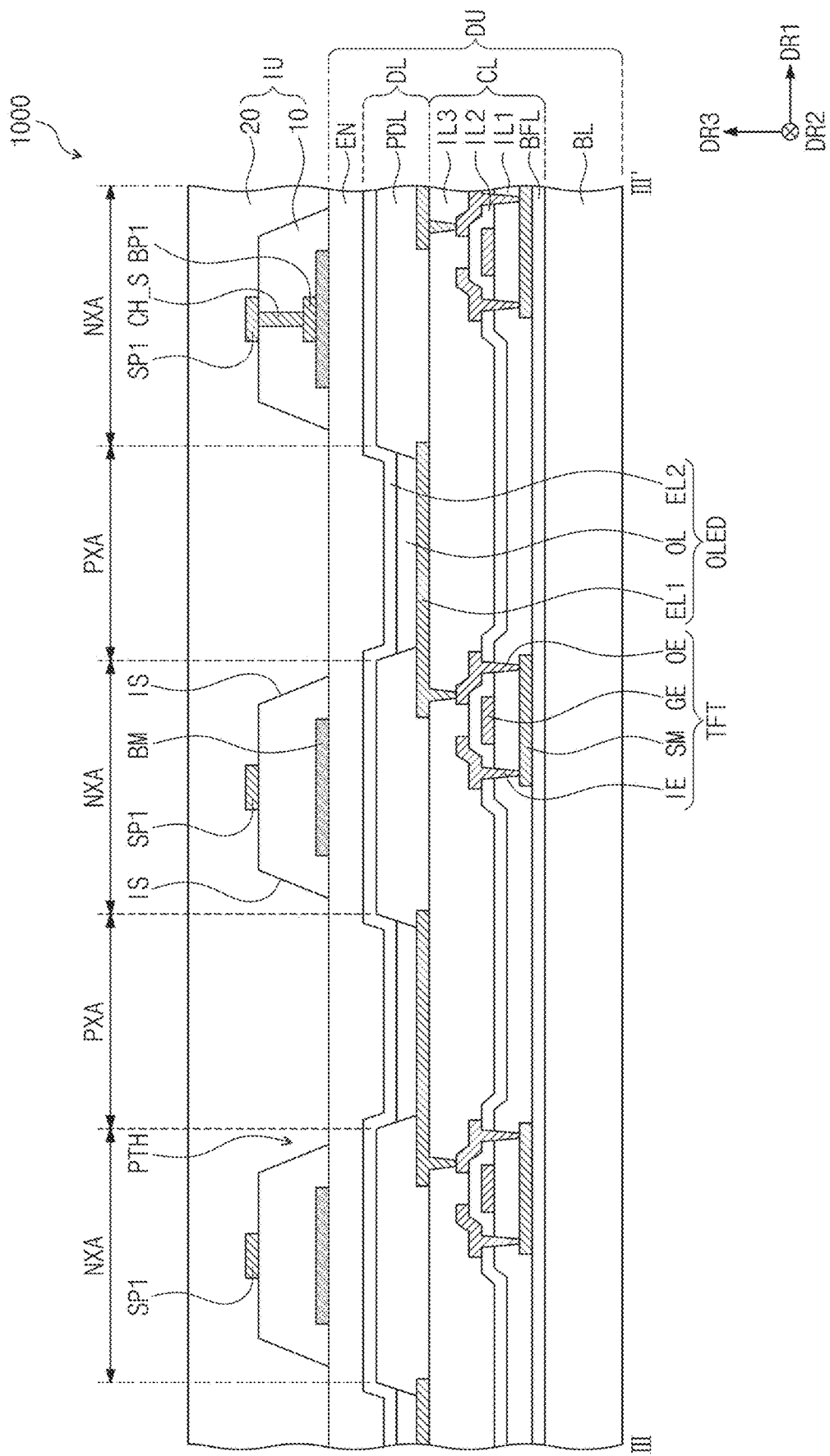
FIG. 8 is a cross-sectional view taken along the line III-III' of FIG. 7.

FIG. 7 is an enlarged view of the region A illustrated in FIG. 5, and FIG. 8 is a cross-sectional view taken along the line III-III' of FIG. 7. For convenience of illustration, the overcoat layer 20 is not shown in FIG. 7.

Referring to FIGS. 7 and 8, the display unit DU includes a base layer BL, a circuit layer CL, a display layer (e.g., a display element layer) DL, and an encapsulation layer EN. The circuit layer CL and the display layer DL are sequentially disposed on the base layer BL. The base layer BL may be made of an insulating material, for example, such as glass and/or plastics. For example, the base layer BL may include glass or a synthetic resin film. However, the present disclosure is not limited thereto, and the base layer BL is not specifically limited as long as it is generally used.

The circuit layer CL includes a functional layer BFL, a plurality of thin film transistors TFT, and first to third intermediate layers IL1 to IL3.

The functional layer BFL may be disposed on the base layer BL. For example, the functional layer BFL may be a buffer layer. The buffer layer BFL has the function of improving a coupling force between the base layer BL and a layer disposed above the buffer layer BFL. However, the present disclosure is not limited thereto. According to another embodiment of the present disclosure, a functional layer BFL may be a barrier layer. The barrier layer BFL may have a function of preventing or substantially preventing foreign substances from entering the layer disposed above the base layer BL.

Each of the thin film transistors TFT may include a semiconductor layer SM, a control electrode GE, an input electrode IE, and an output electrode OE. The semiconductor layer SM is made of a semiconductor material, and operates as an active layer of the transistor TFT. Each of the semiconductor layers SM may be formed of a material selected from among an inorganic semiconductor or an organic semiconductor.

A first intermediate layer IL1 may be provided on the semiconductor layer SM. The first intermediate layer IL1 covers the semiconductor layer SM. The first intermediate layer IL1 may include at least one of an organic insulating material or an inorganic insulating material.

The control electrode GE and the second intermediate layer IL2 are sequentially disposed on the first intermediate layer IL1. The control electrode GE may be formed to cover (e.g., to overlap with) a region corresponding to a channel area of the semiconductor layer SM. The input electrode IE and the output electrode OE are disposed on the second intermediate layer IL2. The input electrode IE and the output electrode OE may be connected to the semiconductor layer SM via control contact holes formed in the first intermediate layer IL1 and the second intermediate layer IL2.

The third intermediate layer IL3 is disposed on the input electrode IE, the output electrode OE, and the second intermediate layer IL2. The third intermediate layer IL3 may serve as a protective film that protects the thin film transistor TFT, and serves as a planarization layer that makes the top surface of the thin film transistor TFT flat or substantially flat.

The display layer DL includes organic light emitting elements OLED. The organic light emitting elements OLED are disposed on the third intermediate layer IL3 of the circuit layer CL. Each of the organic light emitting elements OLED includes a first electrode EL1, a second electrode EL2 disposed on the first electrode EL1, and a light emitting layer OL disposed between the first electrode EL1 and the second electrode EL2. The organic light emitting element OLED and the thin film transistor TFT constitute the pixel PX (e.g., see FIG. 2) described above.

The first electrode EL1 may be a pixel electrode or a positive electrode. The first electrode EL1 may be a semi-transmissive or reflective electrode. For example, the first electrode EL1 may include Ag, Mg, Al, Pt, Pd, Au, Ni, Nd, Ir, Cr, or a mixture thereof. As another example, the first electrode EL1 may have a multi-layered structure including a reflective film or a semi-transmissive film made of one or more of the materials described above, and a transparent conductive film made of indium tin oxide (ITO), indium zinc oxide (IZO), zinc oxide (ZnO), or indium tin zinc oxide (ITZO).

The second electrode EL2 may be a common electrode or negative electrode. The second electrode EL2 may be a transmissive electrode. For example, the second electrode EL2 may include indium tin oxide (ITO), indium zinc oxide (IZO), zinc oxide (ZnO), or indium tin zinc oxide (ITZO). However, the present disclosure is not limited thereto, and for example, the second electrode EL2 may include a metal such as Li, Ca, LiF/Ca, LiF/Al, Al, Mg, BaF, Ba, or Ag, or a compound or mixture thereof (for example, a mixture of Ag and Mg).

A pixel defining layer PDL may be disposed on the first electrode EL1. The pixel defining layer PDL may allow a portion of the first electrode EL1 to be covered, and another portion thereof to be exposed. In other words, the pixel defining layer PDL may be disposed on the first electrode EL1, and may have an opening that exposes a portion of the first electrode EL1.

The pixel defining layer PDL may define a plurality of light emitting areas PXA, and a non-light emitting area NXA that surrounds (e.g., around peripheries of) the light emitting areas PXA. A portion of an area of each of the first electrodes EL1, which is exposed by the pixel defining layer PDL, may be defined as a light emitting area PXA.

The light emitting layer OL may be disposed between the first electrode EU and the second electrode EL2. The light emitting layer OL may be disposed at (e.g., in or on) the light emitting area PXA defined by the pixel defining layer PDL.

A plurality of common layers, in addition to the light emitting layer OL, may be defined between the first electrode EL1 and the second electrode EL2. For example, a hole injection layer, a hole transport layer, an electron transport layer, and an electron injection layer may be sequentially stacked between the first electrode EL1 and the second electrode EL2. In addition, at least one of a hole blocking layer, a hole buffer layer, or an electron blocking layer may be further disposed between the first electrode EL1 and the second electrode EL2.

The encapsulation layer EN may be disposed above the display layer DL. The encapsulation layer EN may cover the display layer DL. The encapsulation layer EN protects the display layer DL from external moisture and/or pollutants. The encapsulation layer EN may include at least one inorganic film and at least one organic film.

According to the present embodiment, the light emitting element layers OL of the light emitting elements OLED may be exposed through the openings MSL-OP, which are defined by the plurality of mesh lines MSL. In other words, when viewed in a plan view, the plurality of mesh lines MSL may be disposed between the plurality of light emitting areas PXA. Thus, the light emitting area PXA is not covered by the first sensing electrodes TE1 and the second sensing electrodes TE2 including the mesh lines MSL, and thus, the display quality of the display apparatus 1000 may be improved. According to the present embodiment, when viewed in a plan view, a first area defined as an area occupied by each of the openings MSL-OP may be greater than a second area defined as an area occupied by each of the light emitting areas PXA.

In FIGS. 7 and 8, the first conductive pattern BP1 and the second conductive pattern SP1, SP2, and BP2 are provided in the form of mesh lines MSL that do not overlap with the light emitting areas PXA, but the present disclosure is not limited thereto. For example, according to another embodiment of the present disclosure, in a case where the second conductive pattern SP1, SP2, and BP2 has light transmitting characteristics, or in other words, in a case where the second conductive pattern SP1, SP2, and BP2 is a transparent electrode, the mesh lines MSL of each of the first conductive pattern BP1 and the second conductive pattern SP1, SP2, and BP2 may overlap with the light emitting area PXA. In another embodiment of the case in which the second conductive pattern SP1, SP2, and BP2 has light transmitting characteristics, each of the first conductive pattern BP1 and the second conductive pattern SP1, SP2, and BP2 may not include the mesh lines MSL.

As described above, the insulating layer 10 according to an embodiment of the present disclosure includes a plurality of light collecting patterns PTH. Each of the light collecting patterns PTH may have a shape that is recessed downward from the top surface of the insulating layer 10. In other words, the overcoat layer 20 disposed above the insulating layer 10 may include protrusion patterns PTH that protrude downward from the bottom surface of the overcoat layer 20 that is in contact with the top surface of the insulating layer 10. The light collecting patterns (or the protrusion patterns) PTH may overlap with the light emitting areas PXA in one-to-one correspondence.

In the present embodiment, each of the light collecting patterns PTH may be a pattern hole PTH that passes through (e.g., that penetrates) the insulating layer 10. In other words, a height of each of the light collecting patterns PTH in the third direction DR3 may be the same or substantially the same as a thickness of the insulating layer 10 (e.g., in the third direction DR3). Thus, the light emitting areas PXA of the display unit DU may be exposed by the light collecting patterns PTH. The spaces defined by the light collecting patterns PTH may be filled with the overcoat layer 20. Thus, a portion of the top surface of the display unit DU exposed by the light collecting patterns PTH may be in contact with the overcoat layer 20.

When viewed in a plan view, a third area defined as an area occupied by the portion exposed by the pattern hole PTH is less than (e.g., is smaller than) the first area and greater than the second area.

The input sensing unit IU according to an embodiment of the present disclosure may further include a light blocking layer BM. The light blocking layer BM is disposed between the display unit DU and the insulating layer 10. The light blocking layer BM overlaps with the non-light emitting area NXA when viewed in a plan view. The top surface and side surfaces of the light blocking layer BM may be covered by the insulating layer 10. The first connection pattern BP1 may be disposed between the light blocking layer BM and the insulating layer 10.

FIG. 9 is a view illustrating an optical path of light provided from an organic light emitting element.

Referring to FIG. 9, each of the light collecting patterns PTH includes an inclined surface IS. For example, the inner surface of each of the pattern holes PTH may include the inclined surface IS, which is inclined downward from the top surface of the insulating layer 10. Each of the light collecting patterns PTH may have a width that gradually increases as it extends away from the display unit DU in the third direction DR3.

When viewed in a plan view, an area occupied by the inclined surface IS is defined as an inclined area IA, and the inclined area IA does not overlap with the light emitting area PXA. FIG. 9 illustrates that the inclined area IA does not overlap with the light blocking layer BM, but the present disclosure is not limited thereto, and in another embodiment of the present disclosure, for example, the inclined area IA may partially overlap with the light blocking layer BM.

In a case where the insulating layer 10 does not include the light collecting patterns PTH unlike in the embodiment shown in FIGS. 7 to 9, the display quality may be deteriorated due to lateral light LT. The lateral light LT may be defined as light corresponding to the external light that is incident to the display apparatus 1000 from the outside and then reflected by the first electrode EL1, and having an angle (e.g., a predetermined angle) with respect to the third direction DR3. For example, in a case where the display apparatus 1000 displays a black color, or in other words, in a case where the organic light emitting elements OLED are not driven, the optical path of the lateral light LT corresponding to the external light that is reflected toward the side surface different from the front surface having the third direction DR3 is different from the optical path of the front light, and thus, a phase delay value for the lateral light LT in the phase delay layer PRL (e.g., see FIG. 3) may be different from a phase delay value for the front light. Thus, the lateral light LT that has passed through the phase delay layer PRL may not be absorbed by the polarizing layer POL (e.g., see FIG. 3). In other words, in a dark state in which the display apparatus 1000 displays the black color, a contrast ratio of the display apparatus 1000 may be deteriorated. However, according to the present embodiment, as each of the pattern holes PTH has the inclined surface IS, the lateral light LT of the light provided from the organic light emitting elements OLED is reflected by the inclined surface IS, and then may be discharged upward. In other words, as the lateral light LT is reflected by the inclined surface IS, the phase delay value in the phase delay layer PRL (e.g., see FIG. 3) may be reduced.

An inclination angle θ, which is defined as an angle formed between the inclined surface IS of each of the light collecting patterns PTH and the bottom surface of the insulating layer 10, may be about 30 degrees to about 70 degrees. In a case where the inclination angle θ is less than 30 degrees, the lateral light LT may not be incident to the inclined surface IS, and in a case where the inclination angle θ is greater than 70 degrees, even though the lateral light LT is reflected by the inclined surface IS, the reflected lateral light LT may not be discharged upward. In an example embodiment, when the inclination angle θ is about 60 degrees to about 63 degrees, the light collection efficiency for the lateral light LT may be increased or maximized.

Also, unlike in the present embodiment of the present disclosure, in a case where the light blocking layer BM is exposed to the overcoat layer 20, or disposed adjacent to the light emitting area PXA, the light discharged from the organic light emitting element OLED may be absorbed by the light blocking layer BM. In this case, the optical efficiency of the display apparatus 1000 may be deteriorated, and the display quality of the display apparatus 1000 according to a viewing angle thereof may be deteriorated. However, according to the present embodiment of the present disclosure, the light blocking layer BM is disposed to be spaced apart from the light emitting area PXA, and the light blocking layer BM is covered by the insulating layer 10, and thus, the light blocking layer BM is not exposed to the overcoat layer 20. Thus, there may be no loss of the light that is discharged from the organic light emitting element OLED. In the present embodiment, a spaced distance D1 between the light blocking layer BM and the light emitting area PXA may be about 3 μm or higher.

Accordingly, according to the present embodiment of the present disclosure, the display quality of the display apparatus 1000 may be improved.

Figure 10:
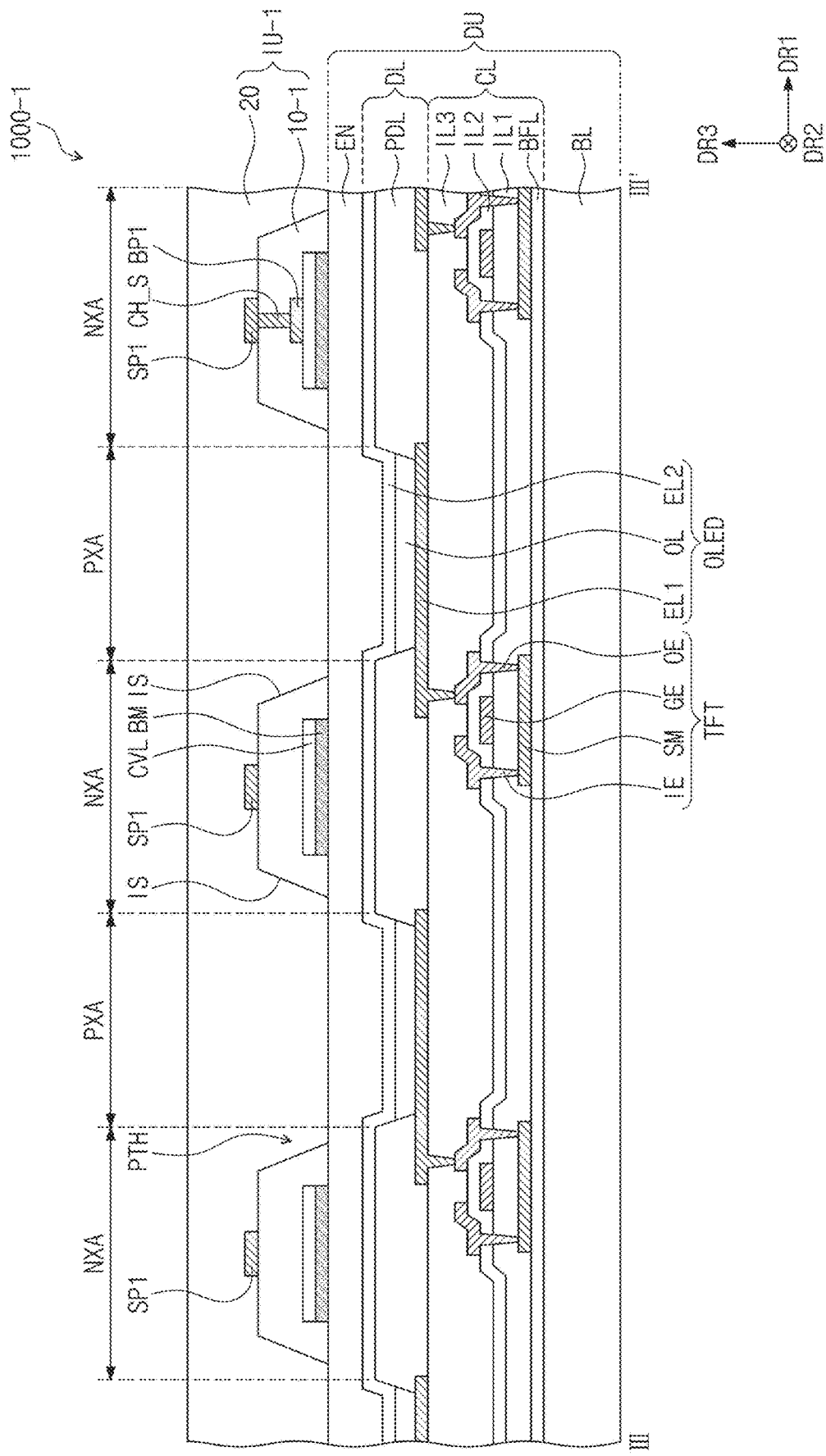
FIG. 10 is a cross-sectional view of a display apparatus according to another embodiment of the present disclosure.

FIG. 10 is a cross-sectional view of a display apparatus according to another embodiment of the present disclosure.

For convenience of description, differences in the embodiment of FIG. 10 from the embodiment of FIGS. 8 and 9 of the present disclosure may be mainly described, and the same reference symbols are given to the same or substantially the same components as those described above. Thus, redundant description thereof may not be repeated.

Referring to FIG. 10, an input sensing unit (e.g., an input sensing layer or an input sensing panel) IU-1 of a display apparatus 1000-1 according to another embodiment of the present disclosure may further include a cover layer CVL. The cover layer CVL is disposed between the light blocking layer BM and the first connection pattern BP1. The light blocking layer BM and the first connection pattern BP1 may be spaced apart from each other by the cover layer CVL. The cover layer CVL may include an inorganic material. For example, the cover layer CVL may include silicon nitride (SiNx).

FIG. 10 illustrates a case where the cover layer CVL is disposed on an entire top surface of the light blocking layer BM, but the present disclosure is not limited thereto. In another embodiment of the present disclosure, the cover layer CVL may be disposed at (e.g., in or on) only a partial area on the light blocking layer BM on which the first connection pattern BP1 is disposed.

In a case where the first connection pattern BP1 is directly disposed on the light blocking layer BM unlike in the present embodiment, patterning of the first connection pattern BP1 may not be uniform or substantially uniform during a patterning process due to a difference in material properties between the first connection pattern BP1 and the light blocking layer BM. However, according to the present embodiment, the cover layer CVL serving as a buffer layer is disposed between the first connection pattern BP1 and the light blocking layer BM, and thus, the coupling force between the first connection pattern BP1 and the light blocking layer BM may be improved.

Also, according to the present embodiment, corrosion of the first connection pattern BP1 may be alleviated by the light blocking layer BM that includes an organic material.

Figure 11:
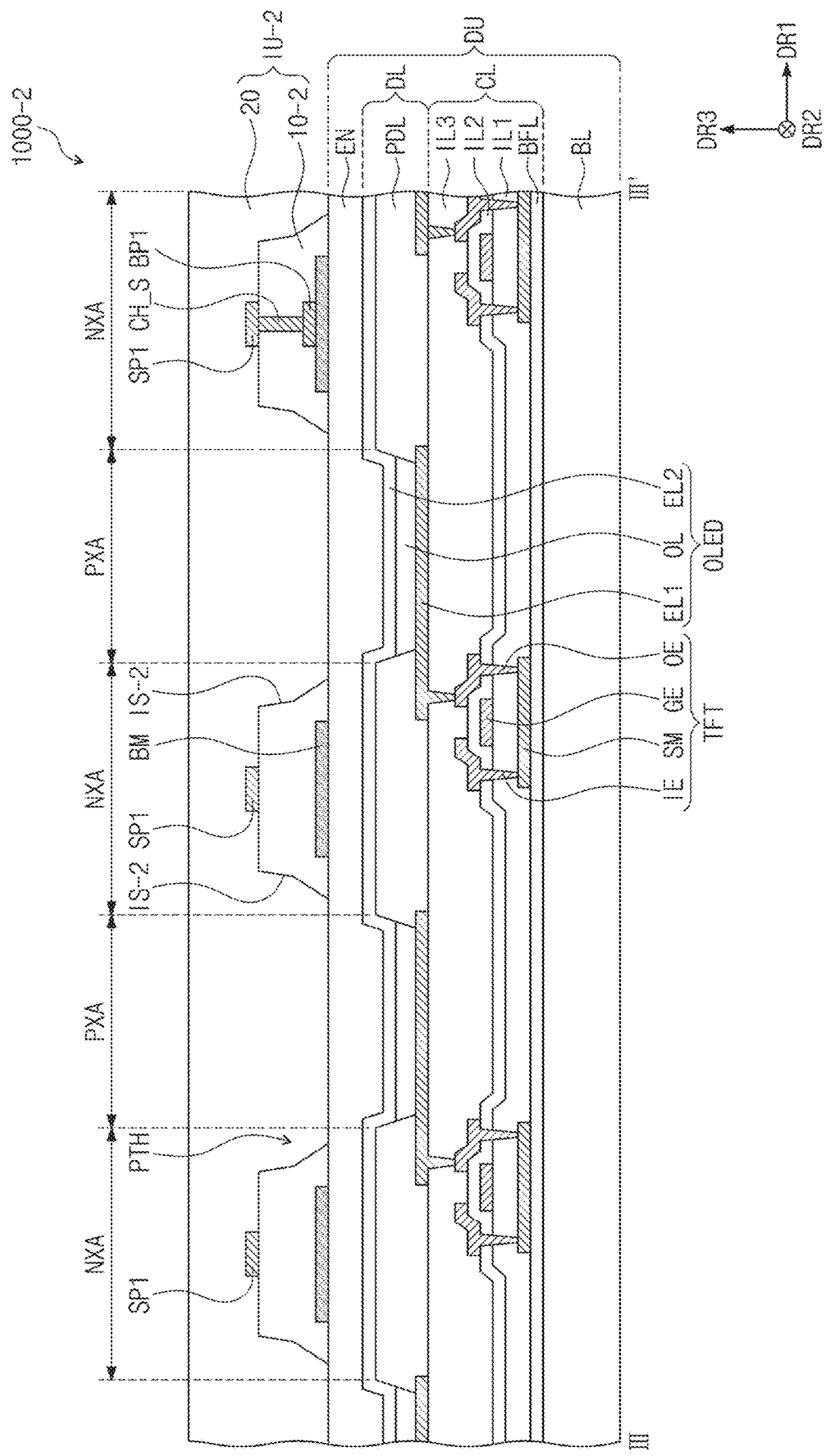
FIG. 11 is a cross-sectional view of a display apparatus according to another embodiment of the present disclosure.

FIG. 11 is a cross-sectional view of a display apparatus according to another embodiment of the present disclosure, and FIG. 12 is an enlarged view of a portion of an insulating layer illustrated in FIG. 11.

For convenience of description, differences in the embodiment of FIGS. 11 and 12 from the embodiment of FIGS. 8 and 9 of the present disclosure may be mainly described, and the same reference symbols are given to the same or substantially the same components as those described above. Thus, redundant description thereof may not be repeated.

Referring to FIGS. 11 and 12, an insulating layer 10-2 of an input sensing unit (e.g., an input sensing layer or an input sensing panel) IU-2 according to another embodiment of the present disclosure defines a plurality of pattern holes PTH. The inner surface of each of the pattern holes PTH may include an inclined surface IS-2.

The inclined surface IS-2 of each of the pattern holes PTH according to the present embodiment may be provided in a plurality. For example, the inclined surface IS-2 may include first and second inclined surfaces IS1 and IS2.

The first inclined surface IS1 is connected to the bottom surface of the insulating layer 10-2. The first inclined surface IS1 has a first inclination angle θ1 with respect to the bottom surface of the insulating layer 10-2.

The second inclined surface IS2 connects the first inclined surface IS1 to the top surface of the insulating layer 10-2. The second inclined surface IS2 has a second inclination angle θ2 with respect to the bottom surface of the insulating layer 10-2.

In the present embodiment, the first inclination angle θ1 may be less than the second inclination angle θ2.

According to the present embodiment, the inclination angles θ1 and θ2 of the inclined surfaces IS1 and IS2 are set to be different from each other, and thus, a degree in which the lateral light LT (e.g., see FIG. 9) that is incident to the inclined surfaces IS1 and IS2 is collected upward may be controlled according to incident angles thereof.

Figure 13:
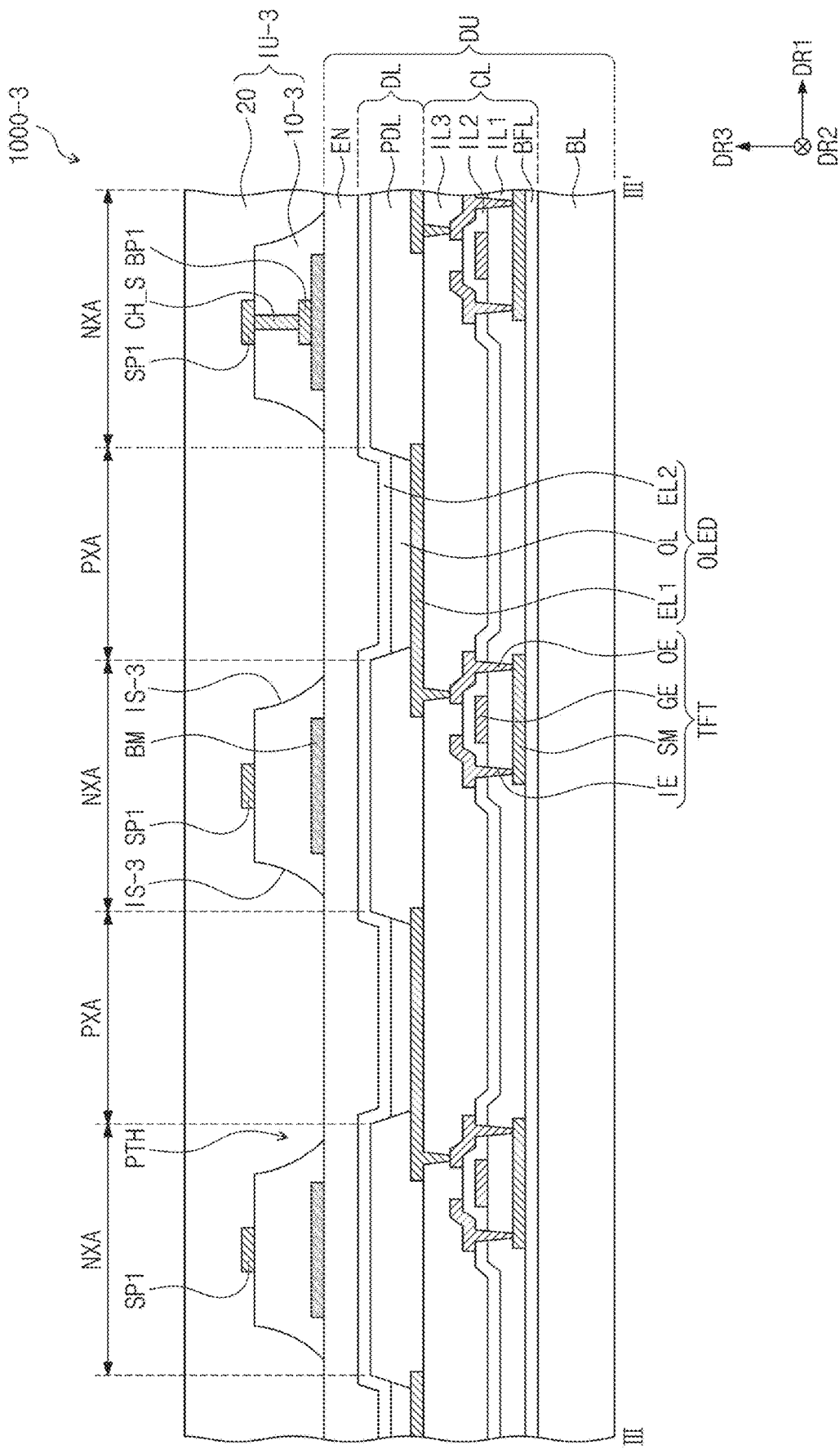
FIG. 13 is a cross-sectional view of a display apparatus according to another embodiment of the present disclosure.

FIG. 13 is a cross-sectional view of a display apparatus according to another embodiment of the present disclosure, and FIG. 14 is an enlarged view of a portion of an insulating layer illustrated in FIG. 13.

For convenience of description, differences in the embodiment of FIGS. 13 and 14 from the embodiment of FIGS. 8 and 9 of the present disclosure will be mainly described, and the same reference symbols are given to the same or substantially the same components as those described above. Thus, redundant description thereof may not be repeated.

Referring to FIGS. 13 and 14, an insulating layer 10-3 of an input sensing unit (e.g., an input sensing layer or an input sensing panel) IU-3 according to another embodiment of the present disclosure defines a plurality of pattern holes PTH. The inner surface of each of the pattern holes PTH may include an inclined surface IS-3.

According to the present embodiment, the inclined surface IS-3 may include a curved surface. For example, the inclined surface IS-3 may have a recessed shape that is recessed toward the bottom surface of the insulating layer 10-3.

According to the present embodiment, as the inclined surface IS-3 has a curvature, the lateral light LT (e.g., see FIG. 9) may be reflected at different angles according to areas of the inclined surface IS-3 on which the lateral light LT is incident. In other words, because the inclined surface IS-3 has reflective surfaces having a plurality of inclination angles θ, a degree in which the lateral light LT (e.g., see FIG. 9) incident to the inclined surface IS-3 is collected upward may be controlled according to the inclination angles thereof.

Figure 15:
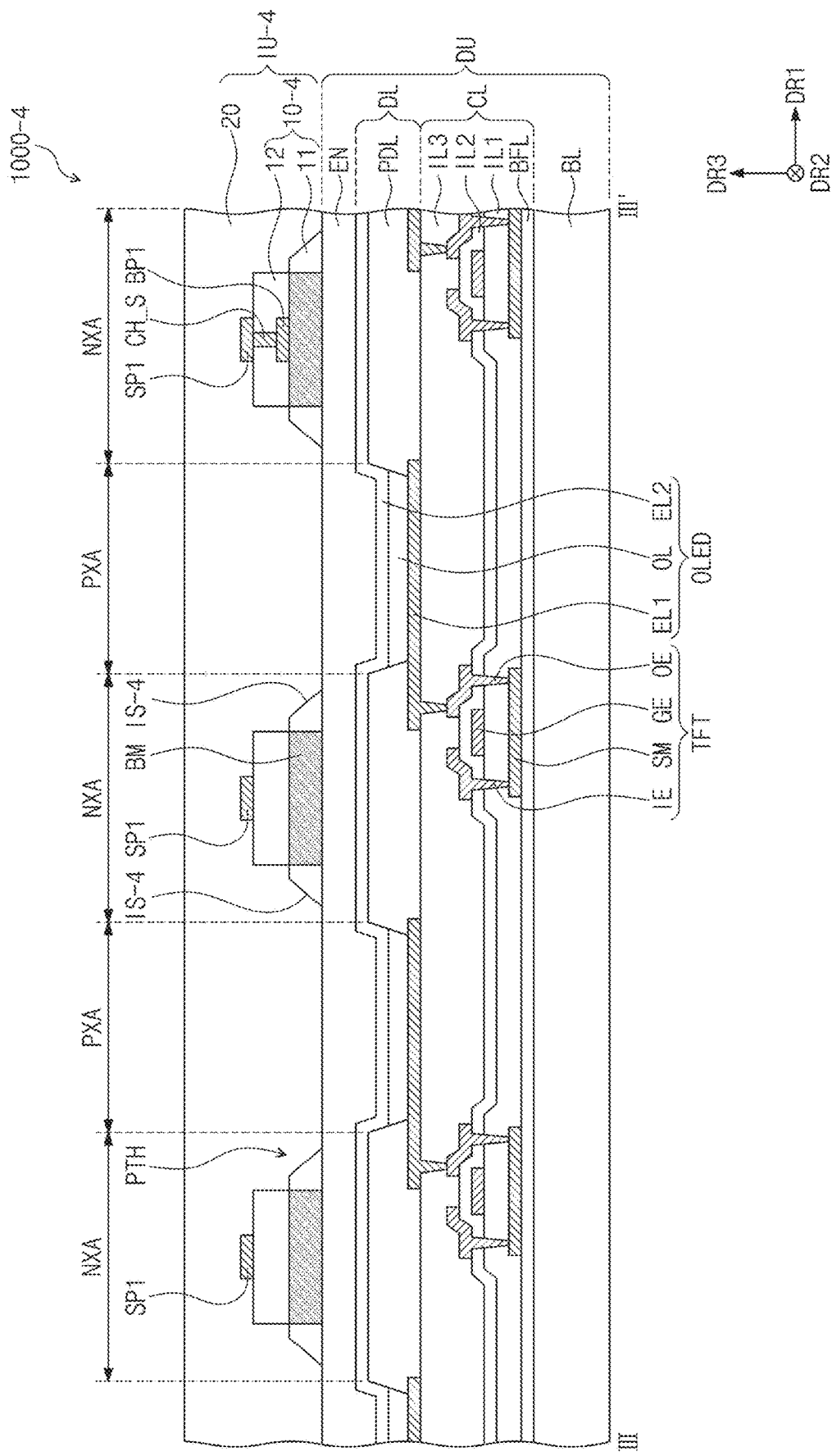
FIG. 15 is a cross-sectional view of a display apparatus according to another embodiment of the present disclosure.
Figure 16:
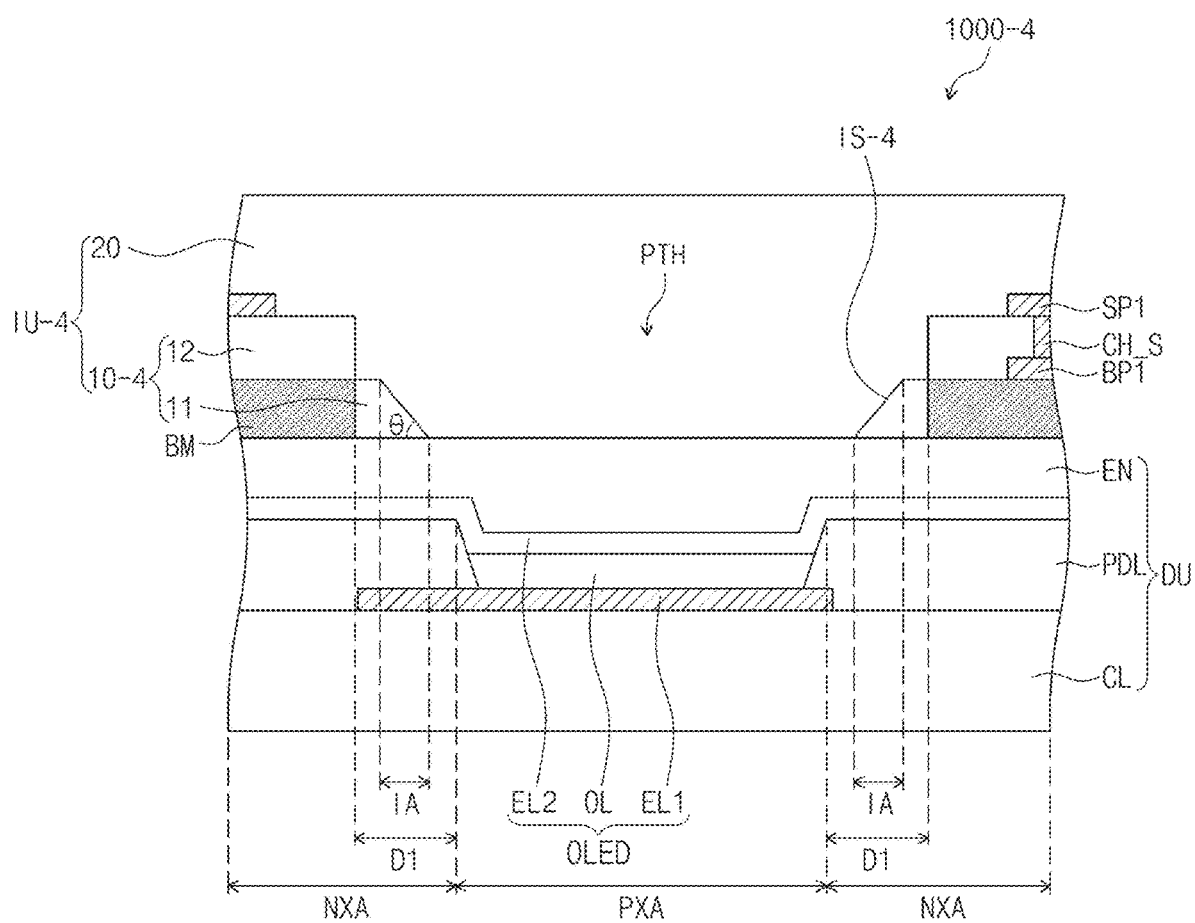
FIG. 16 is an enlarged view of a portion of an insulating layer illustrated in FIG. 15.

FIG. 15 is a cross-sectional view of a display apparatus according to another embodiment of the present disclosure, and FIG. 16 is an enlarged view of a portion of an insulating layer illustrated in FIG. 15.

For convenience of description, differences in the embodiment of FIGS. 15 and 16 from the embodiment of FIGS. 8 and 9 of the present disclosure will be mainly described, and the same reference symbols are given to the same or substantially the same components as those described above. Thus, redundant description thereof may not be repeated.

Referring to FIGS. 15 and 16, an insulating layer 10-4 of an input sensing unit (e.g., an input sensing layer or an input sensing panel) IU-4 according to another embodiment of the present disclosure includes a first section 11 and a second section 12.

The first section 11 is disposed outside the light blocking layer BM. For example, a distance between the first section 11 and the light emitting area PXA is less than a distance D1 between the light blocking layer BM and the light emitting area PXA. The first section 11 covers the side surface of the light blocking layer BM.

In the present embodiment, the first section 11 includes an organic material. The first section 11 has a first refractive index.

The height of the first section 11 in the third direction DR3 may be the same or substantially the same as the height of the light blocking layer BM in the third direction DR3. In other words, the top surface of the first section 11 may be disposed on the same plane as the top surface of the light blocking layer BM.

In the present embodiment, the first section 11 includes an inclined surface IS-4. Because the top surface of the first section 11 and the top surface of the light blocking layer BM are disposed on the same plane, the height of the light blocking layer BM in the third direction DR3 may be greater than the height of the light blocking layer BM of one or more of the embodiments described above.

The second section 12 may be disposed on the light blocking layer BM and the first connection pattern BP1. The second section 12 covers the top surface of the light blocking layer BM and the top surface of the first connection pattern BP1. In the present embodiment, the second section 12 includes an inorganic material. For example, the second section 12 may include silicon nitride (SiNx). In the present embodiment, the second section 12 does not include an inclined surface. However, in another embodiment of the present disclosure, the second section 12 may include an inclined surface in a case where the second section 12 has a refractive index lower than that of the overcoat layer 20.

According to the present embodiment, because the second section 12 including an inorganic material is disposed between the first conductive pattern BP1 and the second conductive pattern SP1, SP2, and BP2, corrosion of first and second conductive patterns BP1 and SP1, SP2, and BP2 may be prevented or substantially prevented.

Figure 17:
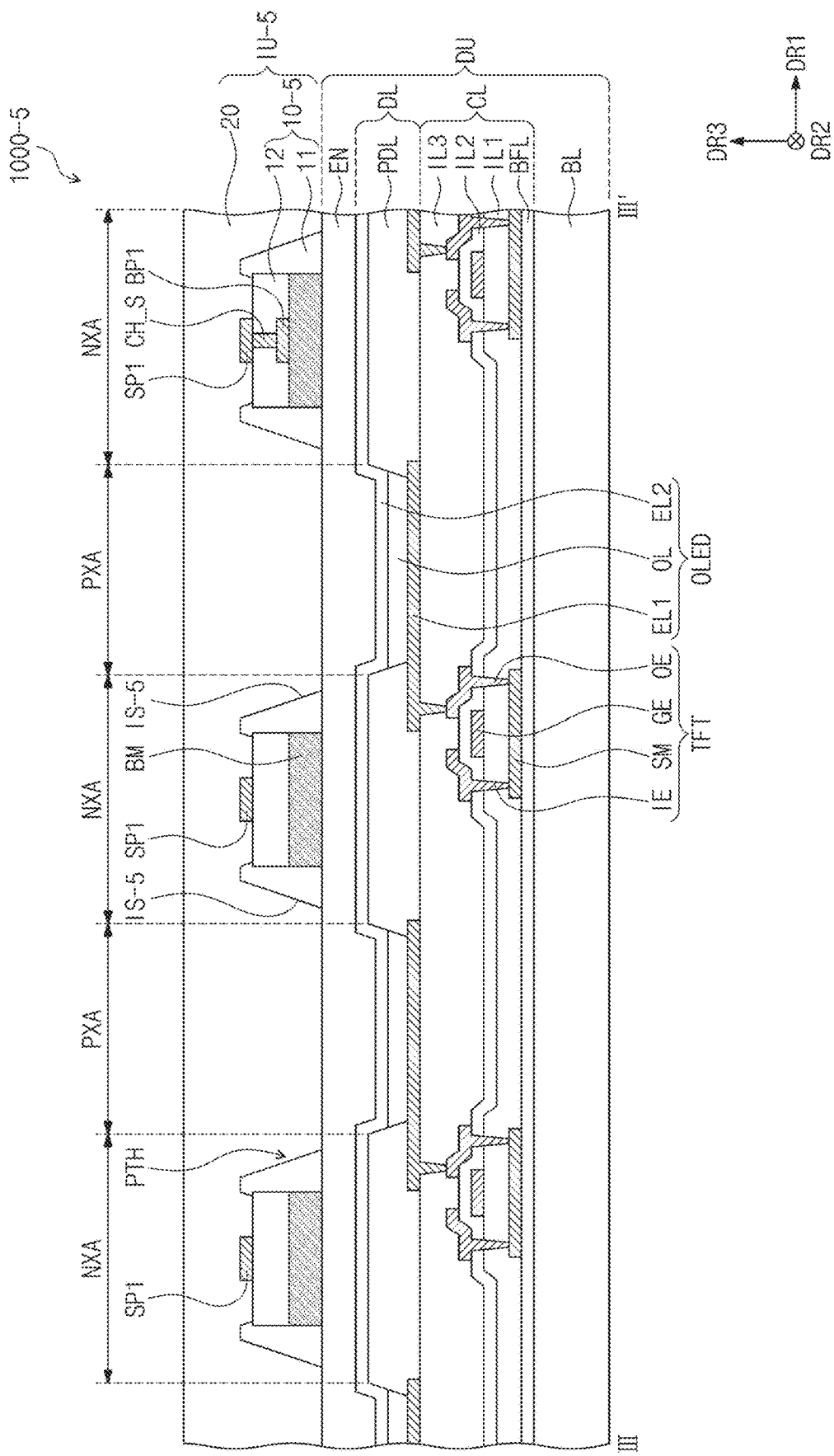
FIG. 17 is a cross-sectional view of a display apparatus according to another embodiment of the present disclosure.

FIG. 17 is a cross-sectional view of a display apparatus according to another embodiment of the present disclosure, and FIG. 18 is an enlarged view of a portion of an insulating layer illustrated in FIG. 17.

For convenience of description, differences in the embodiment of FIGS. 17 and 18 from the embodiment of FIGS. 8 and 9 of the present disclosure will be mainly described, and the same reference symbols are given to the same or substantially the same components as those described above. Thus, redundant description thereof may not be repeated.

Referring to FIGS. 17 and 18, an insulating layer 10-5 of an input sensing unit (e.g., an input sensing layer or an input sensing panel) IU-5 according to another embodiment of the present disclosure includes a first section 11 and a second section 12.

In the embodiment, the first section 11 covers the side surface of the light blocking layer BM and the side surface of the second section 12. The first section 11 may include an inclined surface IS-5.

Also, the maximum height of the first section 11 may be greater than the maximum height of the second section 12. In other words, the top surface of the first section 11 may be disposed at a higher position than the top surface of the second section 12.

According to the present embodiment, because the thickness of the first section 11 (e.g., in the third direction DR3) including the inclined surface IS-5 is greater than the thickness of the first section 11 (e.g., in the third direction DR3) of the embodiment illustrated in FIGS. 15 and 16, the area of a portion to which the lateral light LT (e.g., see FIG. 9) is incident may be increased. In other words, according to the present embodiment of the present disclosure, the light collection efficiency of the pattern holes PTH may be further increased than that in the embodiment illustrated in FIGS. 15 and 16.

Also, the first section 11 covers a portion of the top surface of the second section 12. The portion of the top surface of the second section 12 may be an edge area on the top surface of the second section 12. In another embodiment of the present disclosure, the first section 11 may not cover the top surface of the second section 12.

Figure 19:
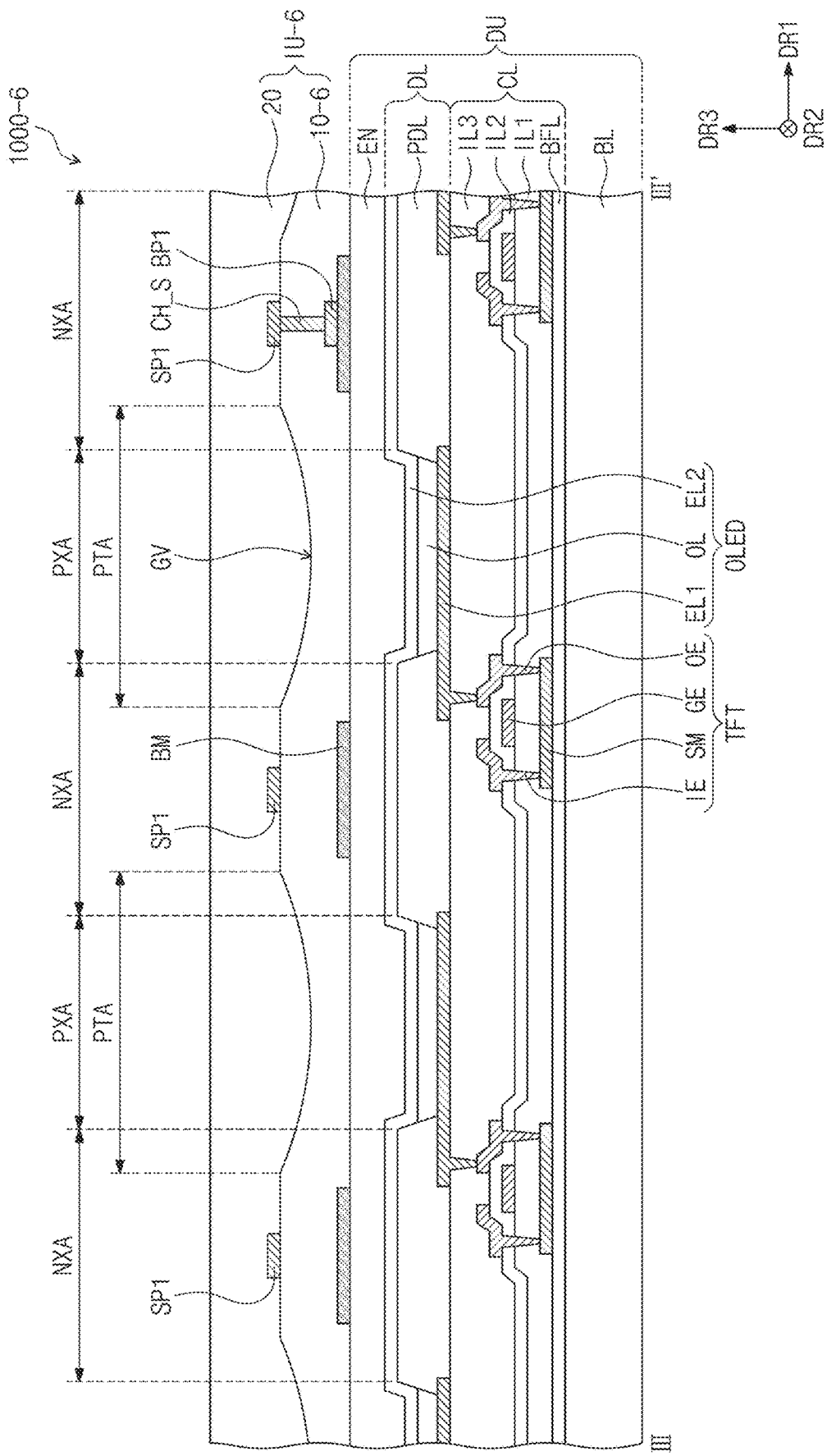
FIG. 19 is a cross-sectional view of a display apparatus according to another embodiment of the present disclosure.
Figure 20:
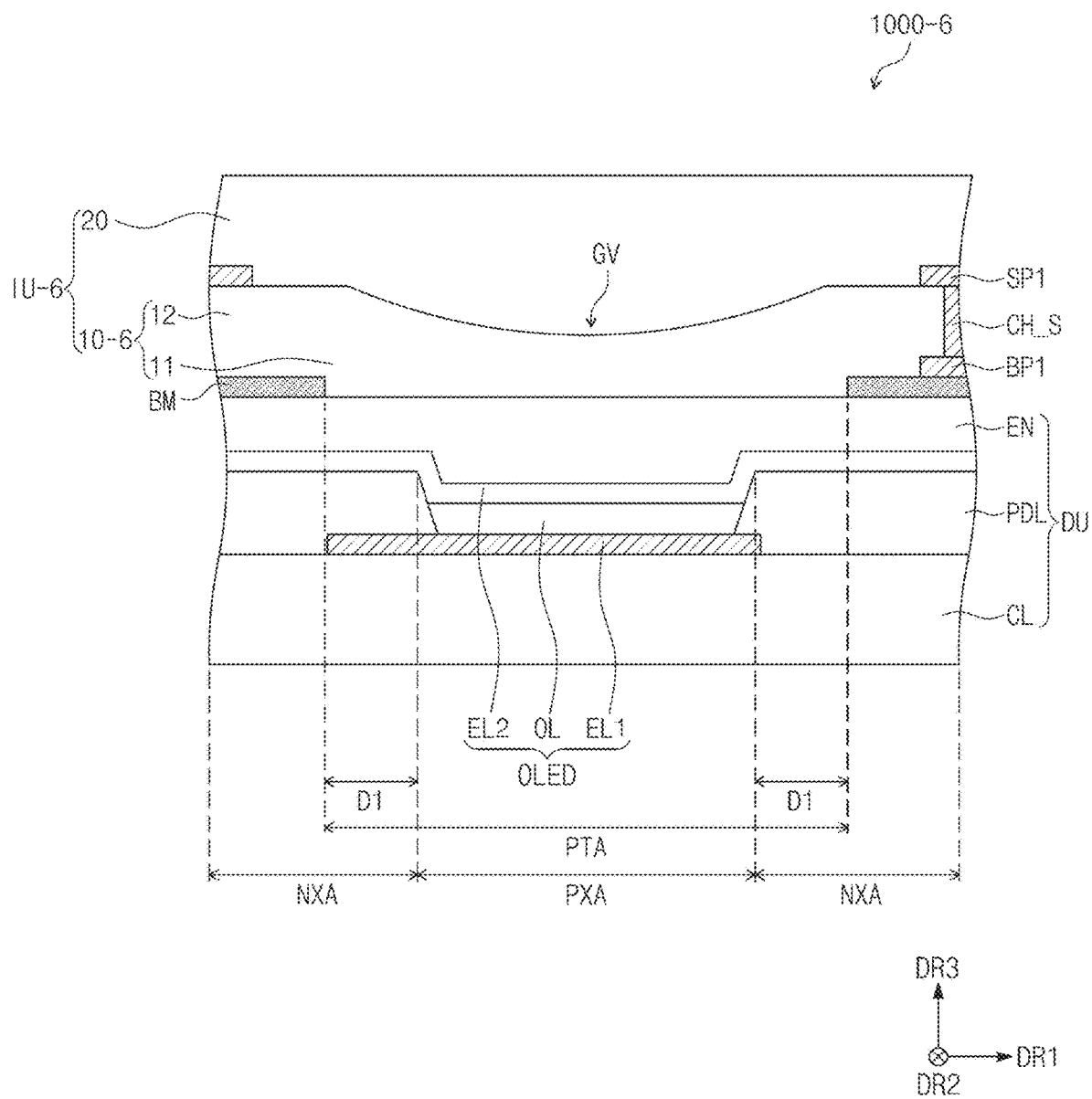
FIG. 20 is an enlarged view of a portion of an insulating layer illustrated in FIG. 19.

FIG. 19 is a cross-sectional view of a display apparatus according to another embodiment of the present disclosure, and FIG. 20 is an enlarged view of a portion of an insulating layer illustrated in FIG. 19.

For convenience of description, differences in the embodiment of FIGS. 19 and 20 from the embodiment of FIGS. 8 and 9 of the present disclosure will be mainly described, and the same reference symbols are given to the same or substantially the same components as those described above. Thus, redundant description thereof may not be repeated.

Referring to FIGS. 19 and 20, an insulating layer 10-6 according to another embodiment of the present disclosure includes a plurality of light collecting patterns GV. Each of the light collecting patterns GV may be a pattern groove GV that is recessed downward from the top surface of the insulating layer 10-6. In the present embodiment, the light collecting patterns GV do not pass through the insulating layer 10-6. In other words, the height of each of the light collecting patterns GV in the third direction DR3 may be less than the thickness of the insulating layer 10-6 (e.g., in the third direction DR3).

In the present embodiment, the pattern groove GV includes a curved surface. For example, the curved surface may have a shape that is recessed downward from the top surface of the insulating layer 10-6. Although FIGS. 19 and 20 illustrate that the pattern groove GV includes the curved surface, the present disclosure is not limited thereto. For example, in another embodiment of the present disclosure, the inner surface of the pattern groove GV may include an inclined surface having a constant or substantially constant inclination angle.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

INDUSTRIAL APPLICABILITY

According to one or more example embodiments of the present disclosure, the optical efficiency of an organic light emitting display panel that is generally and widely used as the display apparatus may be improved. Thus, the present disclosure has high industrial applicability.

The invention claimed is:

1. A display apparatus comprising:
a display layer including a plurality of organic light emitting elements and an encapsulation layer covering the plurality of organic light emitting elements, and defining a plurality of light emitting areas and a non-light emitting area surrounding the light emitting areas; and
an input sensing layer on the display layer,
wherein the input sensing layer comprises:
a first conductive pattern on the encapsulation layer;
an insulating layer on the first conductive pattern to cover the first conductive pattern, and defining a plurality of light collecting patterns overlapping with the light emitting areas in a plan view;
a second conductive pattern on a top surface of the insulating layer; and
an overcoat layer on the second conductive pattern to cover the insulating layer and the second conductive pattern,
wherein each of the light collecting patterns is recessed downward from the top surface of the insulating layer, and
wherein a portion of an upper surface of the encapsulation layer is exposed from the light collecting patterns and is covered by the overcoat layer.

2. The display apparatus of claim 1, wherein a refractive index of the overcoat layer is greater than a refractive index of the insulating layer.

3. The display apparatus of claim 2, wherein an inner surface of each of the light collecting patterns has an inclined surface that is inclined downward from the top surface of the insulating layer.

4. The display apparatus of claim 3, wherein each of the light collecting patterns defines a pattern hole that passes through the insulating layer.

5. The display apparatus of claim 3, wherein an angle formed between the inclined surface and a bottom surface of the insulating layer is about 30 degrees to about 70 degrees.

6. The display apparatus of claim 3, wherein the inclined surface comprises:
a first inclined surface having a first angle with respect to a bottom surface of the insulating layer; and
a second inclined surface connected to the first inclined surface and having a second angle with respect to the bottom surface of the insulating layer, and
wherein the first angle is less than the second angle.

7. The display apparatus of claim 3, wherein the inclined surface comprises a curved surface.

8. The display apparatus of claim 1, wherein the insulating layer comprises an organic material.

9. The display apparatus of claim 1, wherein:
the first conductive pattern comprises first connection patterns; and
the second conductive pattern comprises:
first sensing patterns connected to each other by the first connection patterns;
second sensing patterns insulated from the first sensing patterns; and
second connection patterns configured to connect the second sensing patterns to each other.

10. The display apparatus of claim 9, wherein the first sensing patterns are arranged in a first direction in a plan view, and the second sensing patterns are arranged in a second direction crossing the first direction in the plan view,
wherein the first connection patterns and the first sensing patterns are connected to each other to define one first sensing electrode, and the second connection patterns and the second sensing patterns are connected to each other to define one second sensing electrode, and
wherein the first sensing electrode is provided in a plurality and arranged along the second direction, and the second sensing electrode is provided in a plurality and arranged along the first direction.

11. The display apparatus of claim 10, wherein the input sensing layer further comprises a light blocking layer between the display layer and the insulating layer,
- wherein the light blocking layer overlaps with the non-light emitting area in a plan view, and
- wherein the first conductive pattern is located above the light blocking layer.

12. The display apparatus of claim 11, wherein a top surface and a side surface of the light blocking layer are covered by the insulating layer.

13. The display apparatus of claim 11, wherein a spaced distance between the light blocking layer and each of the light emitting areas is about 3 μm.

14. The display apparatus of claim 11, wherein the input sensing layer further comprises a cover layer between the light blocking layer and the first conductive pattern to space the light blocking layer and the first conductive pattern from each other, and
- wherein the cover layer comprises an inorganic material.

15. The display apparatus of claim 11, wherein the insulating layer comprises:
- a first section outside the light blocking layer to cover a side surface of the light blocking layer, the first section comprising an organic material; and
- a second section above the light blocking layer and the first conductive pattern to cover a top surface of the light blocking layer and a top surface of the first conductive pattern, the second section comprising an inorganic material.

16. The display apparatus of claim 15, wherein a side surface of the first section comprises an inclined surface.

17. The display apparatus of claim 15, wherein a maximum height of the first section is greater than a maximum height of the second section, and the first section covers a side surface and a portion of a top surface of the second section.

18. The display apparatus of claim 9, wherein a plurality of openings are defined in the second conductive pattern, the plurality of openings overlapping with the plurality of light emitting areas in a one-to-one correspondence.

19. The display apparatus of claim 1, wherein each of the organic light emitting elements comprises:
- a first electrode connected to a thin film transistor;
- a light emitting layer above the first electrode to overlap with one of the light emitting areas; and
- a second electrode configured to cover the light emitting layer.

20. A display apparatus comprising:
- a display layer comprising a plurality of organic light emitting elements and an encapsulation layer covering the plurality of organic light emitting elements, and defining a plurality of light emitting areas; and
- an input sensing layer on the display layer,
- wherein the input sensing layer comprises:
  - a first conductive pattern on the encapsulation layer;
  - an insulating layer on the first conductive pattern to cover the first conductive pattern;
  - a second conductive pattern on the insulating layer; and
  - an overcoat layer on the second conductive pattern to cover the insulating layer and the second conductive pattern, and cover a portion of the encapsulation layer through a plurality of pattern holes, and
- wherein the plurality of pattern holes overlapping with the light emitting areas in a one-to-one correspondence are defined in the insulating layer, the plurality of pattern holes comprising an inner side surface that is inclined.

* * * * *